United States Patent [19]
Wang

[11] Patent Number: 5,623,502
[45] Date of Patent: Apr. 22, 1997

[54] TESTING OF ELECTRONIC CIRCUITS WHICH TYPICALLY CONTAIN ASYNCHRONOUS DIGITAL CIRCUITRY

[75] Inventor: Hans H. Wang, San Jose, Calif.

[73] Assignee: National Semiconductor Corporation, Santa Clara, Calif.

[21] Appl. No.: 275,896

[22] Filed: Jul. 15, 1994

[51] Int. Cl.[6] .................................................. G01R 31/28
[52] U.S. Cl. ............................................................ 371/22.3
[58] Field of Search ................................. 371/22.1, 22.3, 371/22.6; 327/73.1, 158.1

[56] References Cited

U.S. PATENT DOCUMENTS 4,995,039  2/1991  Sakashita et al. ...................... 371/22.3
5,166,604  11/1992  Ahanin et al. .
5,260,949  11/1993  Hashizume et al. .................... 371/22.3

Primary Examiner—Robert W. Beausoliel, Jr.
Assistant Examiner—P. Vales
Attorney, Agent, or Firm—Skjerven, Morrill, MacPherson, Franklin & Friel; Ronald J. Meetin

[57] ABSTRACT

An electronic circuit containing a plurality of functional elements also contains a like plurality of corresponding test elements used in testing the functional elements. Aside from being transparent to the functional elements during normal circuit operation, the test elements are internally switchable to provide the circuit with real-time observability through a circuit test output, real-time controllability, and state controllability. Functional elements formed with asynchronous digital circuitry can thereby be tested with the test elements.

52 Claims, 18 Drawing Sheets

OBSERVABILITY

OBSERVABILITY WITH
REAL-TIME CONTROLLABILITY

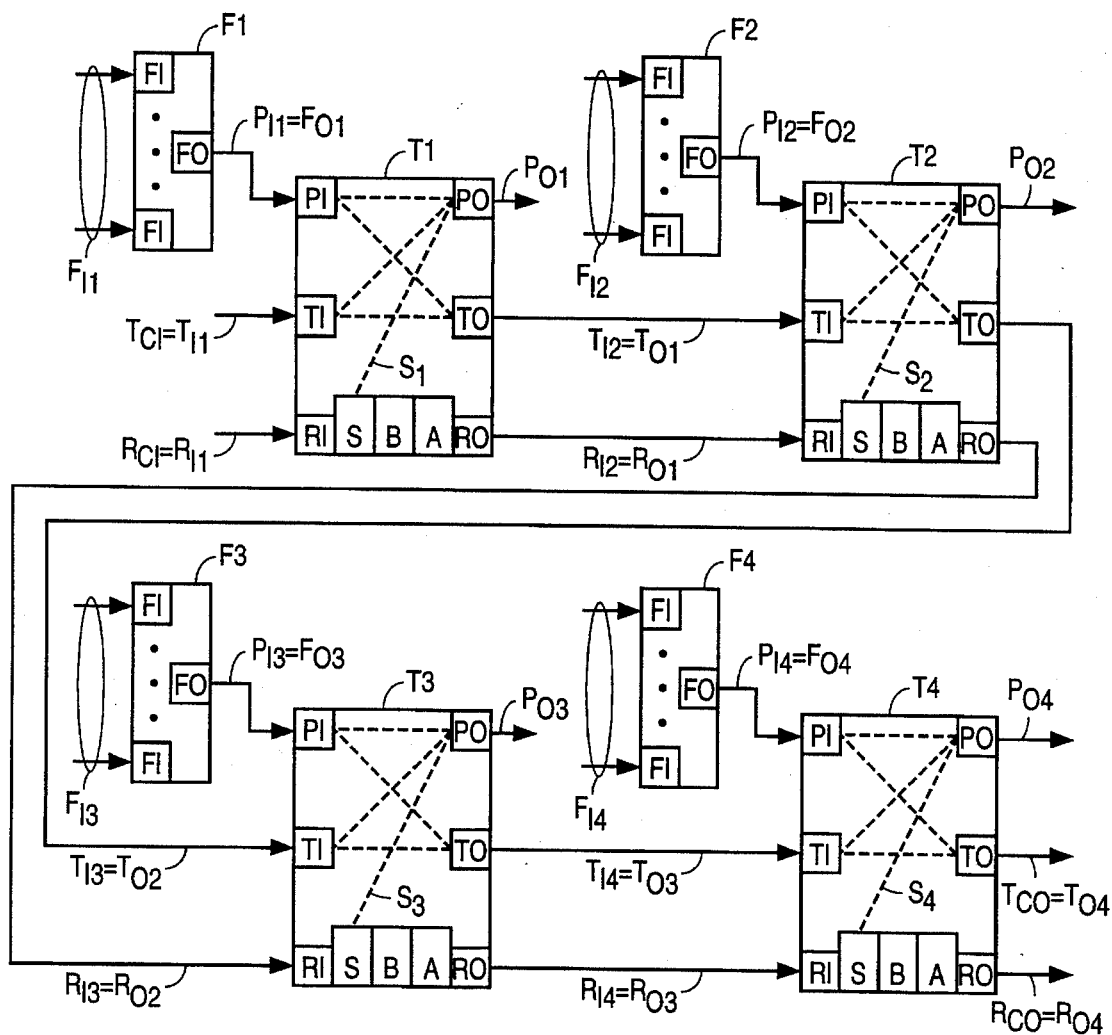
FIG. 7
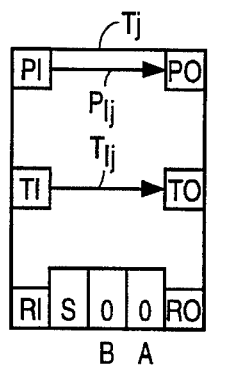
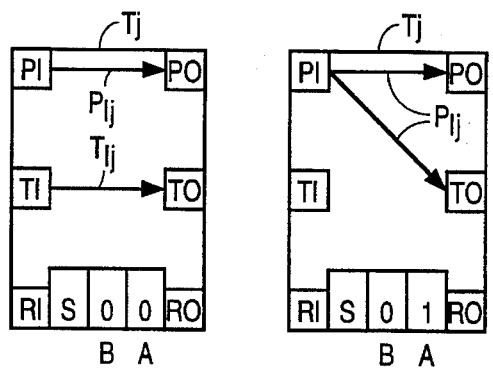
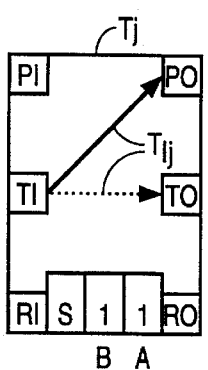
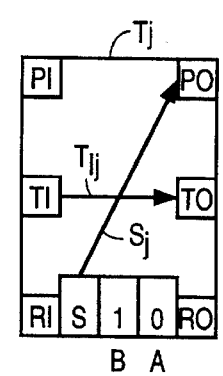
FIG. 8a    FIG. 8b    FIG. 8c    FIG. 8d

OBSERVABILITY WITH
STATE CONTROLLABILITY

OBSERVABILITY WITH
REAL-TIME AND STATE
CONTROLLABILITY

REAL-TIME AND STATE
CONTROLLABILITY

CONTROLLABILITY WITH
SPECIAL OBSERVABILITY

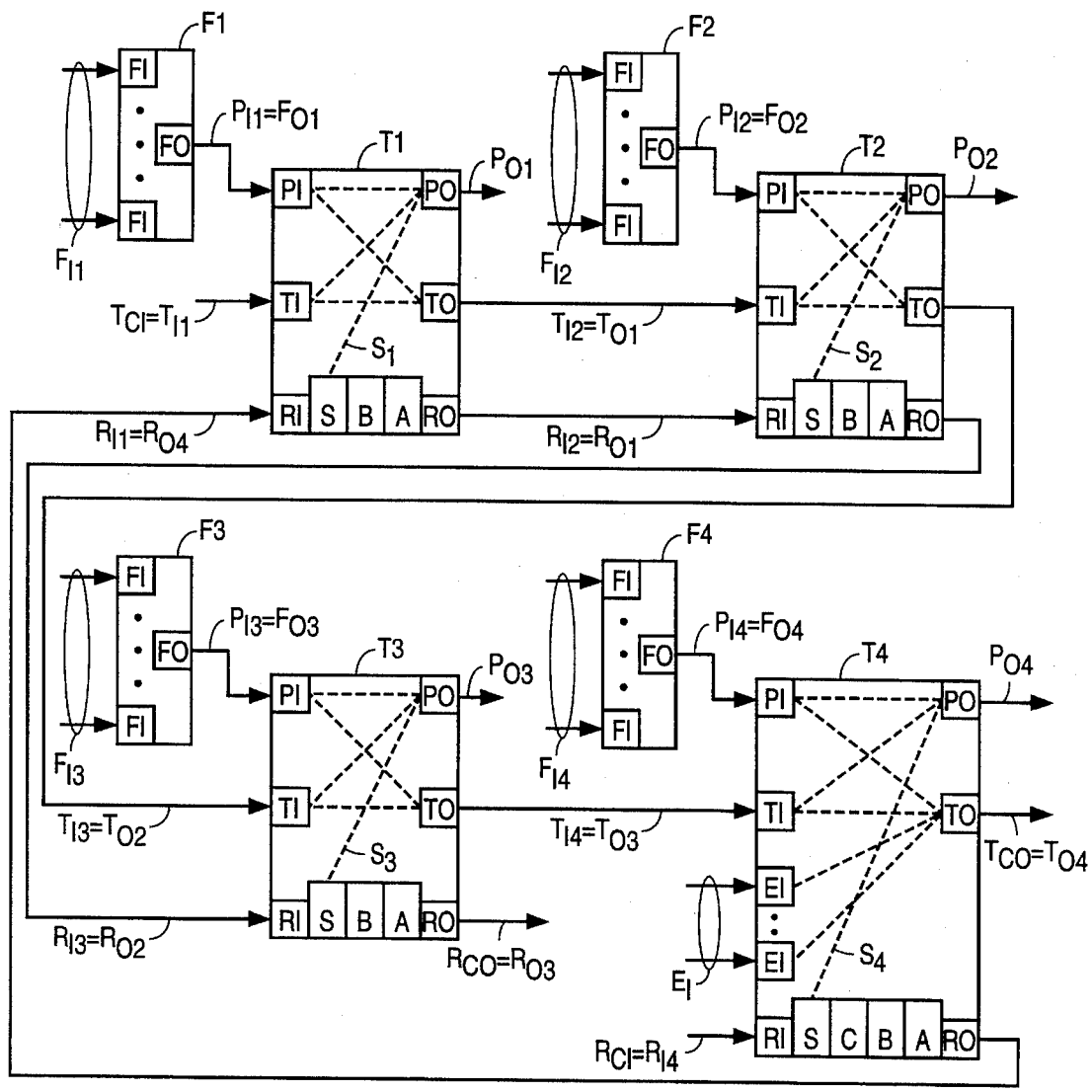
FIG. 23
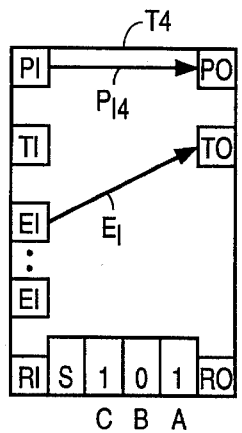 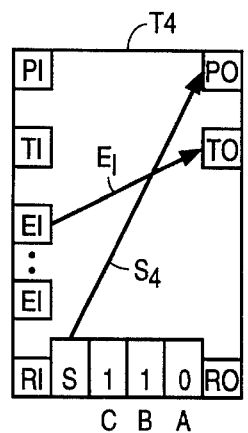 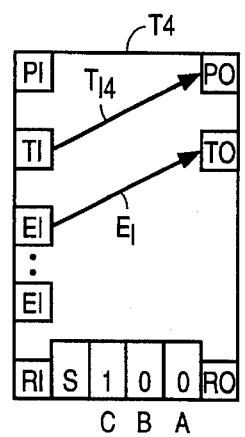 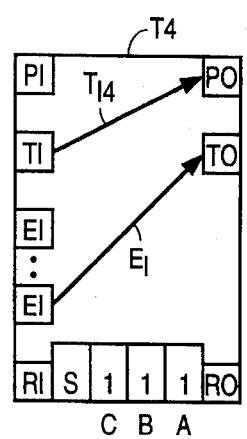
FIG. 24a    FIG. 24b    FIG. 24c    FIG. 24d

CONTROLLABILITY WITH
SPECIAL OBSERVABILITY

CONTROLLABILITY WITH
SPECIAL OBSERVABILITY

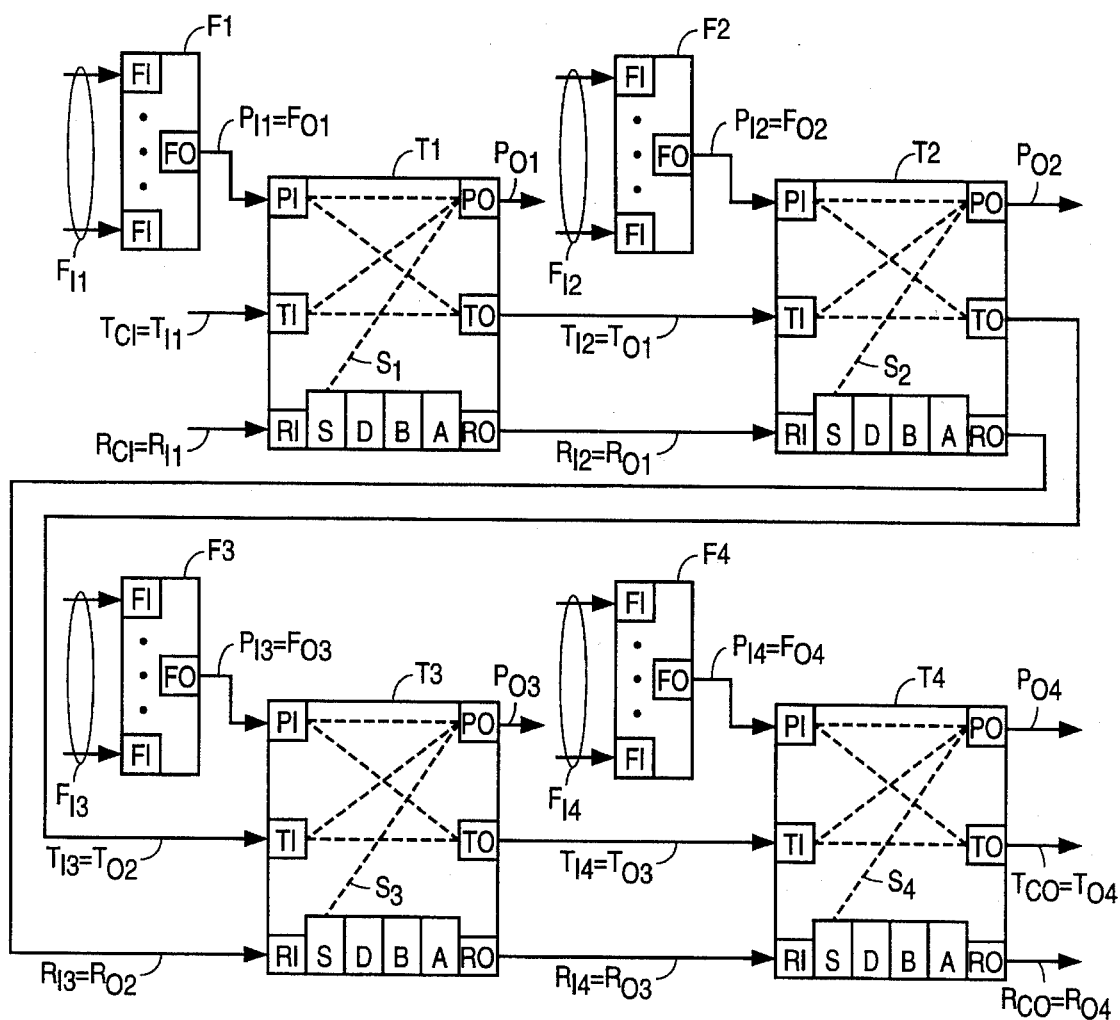
FIG. 29
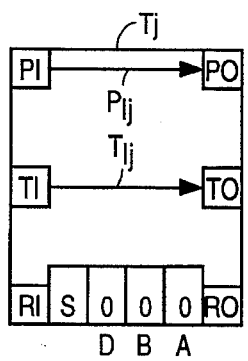 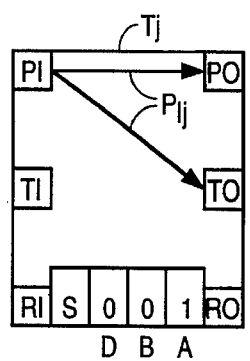 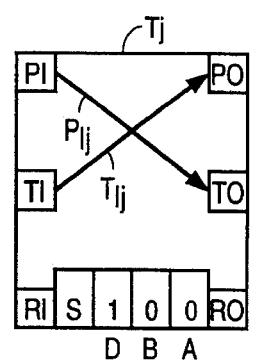 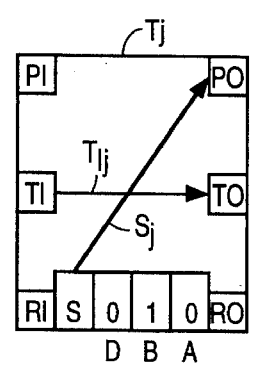
FIG. 30a    FIG. 30b    FIG. 30c    FIG. 30d

OBSERVABILITY WITH
REAL-TIME CONTROLLABILITY

TESTING OF ELECTRONIC CIRCUITS WHICH TYPICALLY CONTAIN ASYNCHRONOUS DIGITAL CIRCUITRY

FIELD OF USE

This invention relates to testing electronic circuits. In particular, this invention relates to mechanisms and techniques for testing asynchronous digital circuitry typically implemented in integrated circuit ("IC") form.

BACKGROUND ART

Testing of an IC is a critical part of circuit development. Factors that affect IC testing include the number of components to be tested in the circuit, the ability to access lines or nodes that carry signals indicating the condition of the components, and the fact that the number of IC pins is normally quite small compared to the number of IC components. As ICs become increasingly more complex, IC testing poses increasing challenges.

Inherent to the development of many ICs is the concept that an IC should be designed in such a manner as to facilitate its testing. This is commonly referred to as design for testability. Two attributes of testability are controllability and observability. Controllability refers to the ability to establish a desired signal value at an internal circuit node by setting appropriate values at the circuit's inputs. Observability refers to the ability to determine the signal value at an internal node by controlling the circuit's input signals and observing the circuit's output signals.

In designing an IC to be testable, keeping the pin count low is typically an important consideration. In other words, the number of pins dedicated to testing the IC should be small. One way of enhancing controllability and observability without paying a large price in test pins is to incorporate a scan register in the IC. A scan register is a group of one-bit registers which can be loaded in parallel and through which information can be shifted from register to register. See Abramovici et al, *Digital Systems Testing and Testable Design* (Computer Science Press), 1990, pages 358–412.

The Joint Test Action Group ("JTAG") boundary-scan approach governed by the IEEE 1149.1 Testability Bus Standard is an example of the scan-register technique. In the boundary-scan standard, boundary-scan cells are situated along the periphery of an IC between the IC's functional (or application) circuitry and the IC's functional input/output ("I/O") pins. In particular, each boundary-scan cell is located between a functional I/O pin and part of the functional circuitry. Each cell typically contains a pair of one-bit registers and multiplexing circuitry for controlling data movement. During normal circuit operation, the multiplexing circuitry enables data to pass through the boundary-scan cells without being affected by the cells. Accordingly, the boundary-scan cells are transparent to the functional circuitry during normal IC operation.

The boundary-scan cells are connected in a chain so that test data can be synchronously shifted—i.e., moved in synchronism with pulses of a clock signal—from one cell to the next in the chain. The cell at one end of the chain is connected to a test input pin through which data is synchronously shifted into the scan cells. Data is synchronously shifted out of the scan cells through a test output pin connected to the cell at the other end of the chain. During test operation, data for testing the functional circuitry can be loaded into the scan cells in parallel from the functional I/O pins or by shifting data in through the test input pin. Test results are determined by observing the functional I/O pins or by observing the test output pin as data is shifted out of the IC.

The boundary-scan approach is useful in testing the general operational characteristics of sequential logic circuitry—i.e., circuit portions having state elements that change value in synchronism with clock pulses. However, the boundary-scan technique provides little capability to test asynchronous logic in which changes in signal value depend on transmission delays through the circuit.

In fact, testing asynchronous digital circuitry is particularly difficult. Unlike synchronous digital circuitry in which signals at internal nodes are set at values long enough to be clocked into state elements so as to be observable, signal values at internal nodes in asynchronous digital circuitry sometimes make multiple changes in value between consecutive pulses of a clock otherwise adequate for testing synchronous circuitry. Such changes in signal value in asynchronous circuitry thus cannot be entered into state elements to be observed.

Furthermore, signal transmission delay is an important parameter in asynchronous digital circuitry. Techniques, such as boundary scan, which are useful in testing synchronous circuitry typically furnish, at best, only a crude approximation of transmission delay. In many ICs, little testing is done on internal asynchronous circuitry. Accordingly, it would be highly advantageous to have a pin-efficient technique for testing asynchronous digital circuitry.

GENERAL DISCLOSURE OF THE INVENTION

The present invention furnishes a technique for testing electronic circuits, especially internal asynchronous digital circuitry in an IC. The invention provides both controllability and real-time observability. The controllability comes in two forms referred to as real-time controllability and state controllability. In real-time controllability, signals that may change value during test are supplied to circuit nodes. In state controllability, signals of fixed value are supplied to circuit nodes.

In accordance with the invention, an internally testable electronic circuit contains a plurality of functional elements and a like plurality of corresponding test elements. Each functional element provides a function output signal. Each test element has (a) a primary input that receives a primary input signal as the function output signal of the corresponding functional element, (b) a test input that receives a test input signal, and (c) a test output.

The in-circuit test elements are arranged in series by way of their test inputs and outputs such that the test output of each test element up to the last one is coupled to the test input of the next test element. The test input of the first test element in the series of test elements is usually a circuit test input. Likewise, the test output of the last test element in the series is usually a circuit test output. Real-time observability of a test on one or more of the functional elements is accomplished by observing test results at the circuit test output.

Normal circuit operation here refers to the mode of operation in which the circuit is being operated in the manner and under the conditions that the circuit is intended to operate in a typical application without being subjected to input test data. During normal circuit operation, the test elements are transparent to the functional elements. When the circuit is furnished with real-time observability at the circuit test output but not with controllability, transparency of the test elements during normal circuit operation can be accomplished without modifying the way in which the functional elements would nominally (i.e., in the absence of the test elements) be interconnected to achieve the intended circuit function. Aside from being provided to the primary inputs of the test elements, the function output signals thus are supplied to their otherwise normal circuit destinations.

When the circuit is provided with controllability according to the invention, the interconnections of the functional elements typically need to be modified so that the test elements are transparent during normal circuit operation yet capable of testing the functional circuitry during test operation. Specifically, one, and typically each, of the test elements is furnished with a primary output. The primary output of each such test element supplies a primary output signal which, in place of the output signal from the corresponding functional element, goes to the circuit node or nodes that would receive the corresponding function output signal if the test element were not present. In effect, the test element is inserted, by way of its primary input and primary output, in the output signal path of the corresponding functional element.

Each test element is capable of being switchably operated in any one of a group of internal test-element conditions. In one of the internal conditions, the test input signal of a test element is provided asynchronously to its test output. When controllability is provided in the circuit, the primary input signal of the test element is simultaneously furnished asynchronously to its primary output.

Each test element is placed in the foregoing internal condition during normal circuit operation. The function output signals thereby all pass directly to their normal circuit destinations or, when the circuit has controllability, all pass through the test elements to the normal destinations for the function output signals. In either case, placing the test elements in this condition causes them to be transparent to the functional elements during normal circuit operation.

Observability of the function output signals at the circuit test output is achieved by furnishing each test element with the capability of being switched to an internal condition in which the primary input signal of that test element is provided asynchronously to its test output. In this observability internal condition, the primary input signal of each so-switched test element is also typically provided to its primary output when controllability is available in the circuit. The output signal of a specified functional element can be observed in real time at the circuit test output by placing the corresponding test element in the observability internal condition while placing the other test elements in the transparent internal condition mentioned above.

Real-time controllability is accomplished by providing one, and typically each, test element with the capability of being switched to a further internal condition in which the test input signal of the test element is asynchronously provided to its primary output. Data supplied to the circuit test input can then be provided through one or more of the test elements to an internal node at the test output of a test element which has been placed in the real-time controllability condition. When a later test element in the series of test elements is placed in the observability internal condition, the effect of inserting data at the internal node is observable in real time at the circuit test output.

State controllability is achieved by furnishing one, and typically each, test element with a storage unit that provides a storage signal indicative of test information placed in the storage unit. The test element is then furnished with the capability of being switched to an internal condition in which the element's test input and storage signals are respectively furnished asynchronously to the element's test and primary outputs. The fixed value of the storage signal is thereby provided to a functional circuit node at the primary output of the test element.

Various combinations of observability, real-time controllability, and state controllability are available in the invention. An electronic circuit configured according to the invention typically includes all three capabilities. However, a circuit could have only one or two of the capabilities. For example, a circuit could have observability and real-time controllability but not state controllability.

One, and typically each, of the test elements has a programmable section which stores program information that determines the test element's internal condition. The programmable section in each test element preferably includes a shift register. An input signal to the shift register is provided at a register input. A register output signal is furnished at a register output. The test elements are arranged in series by way of their register inputs and outputs such that the register output of each test element up to the last one is coupled to the register input of the next test element.

The circuit of the present invention is operated in the following way during test. Each test element is first programmably placed in a selected one of the internal conditions. This typically entails programming the test elements with data suitable to place each of them in one of the available internal test-element conditions and then enabling test operation so as to activate the programming. Input information for the functional elements is then provided at selected values to exercise (i.e., test) the circuit. This includes furnishing data to the circuit test input when the circuit has real-time controllability. When the circuit includes the observability internal condition, the effect of the information-providing step is observable in real time at the circuit test output.

In exercising the circuit during a test, reliance is not placed on clock pulses for controlling propagation of signals through the circuit. Accordingly, the present invention is suitable for testing asynchronous digital circuitry.

The output signals of some of the functional elements are usually supplied through the primary input-primary output paths to internal nodes in the circuit. If the circuit has the real-time observability capability of the invention, the signal transmission delay from the test input to an internal signal node can be determined. If real-time controllability is also present, the signal transmission delay between internal nodes can be ascertained. This is a substantial advantage over the synchronous-circuit testing techniques such as the JTAG boundary-scan approach.

When the present invention is utilized to test an IC, only a small number of I/O pins need to be dedicated for test purposes. The number of test pins is normally no more than that utilized in the boundary-scan technique. Since the invention furnishes a complete asynchronous test capability, the invention provides a large advance over the prior art.

BRIEF DESCRIPTION OF THE DRAWINGS

FIG. 7 is a block diagram of another electronic circuit configured to be internally testable according to the invention.

FIGS. 8a, 8b, 8c, and 8d are diagrams illustrating internal conditions programmable into each test element in the circuit of FIG. 7.

FIG. 23 is a block diagram of a further electronic circuit configured to be internally testable according to the invention.

FIGS. 24a, 24b, 24c, and 24d are diagrams illustrating part of the internal conditions programmable into the last test element in the circuit of FIG. 23.

FIG. 29 is a block diagram of a further electronic circuit configured to be internally testable according to the invention.

FIGS. 30a, 30b, 30c, and 30d are diagrams illustrating part of the internal conditions programmable into each test element in the circuit of FIG. 29.

Figure 1:
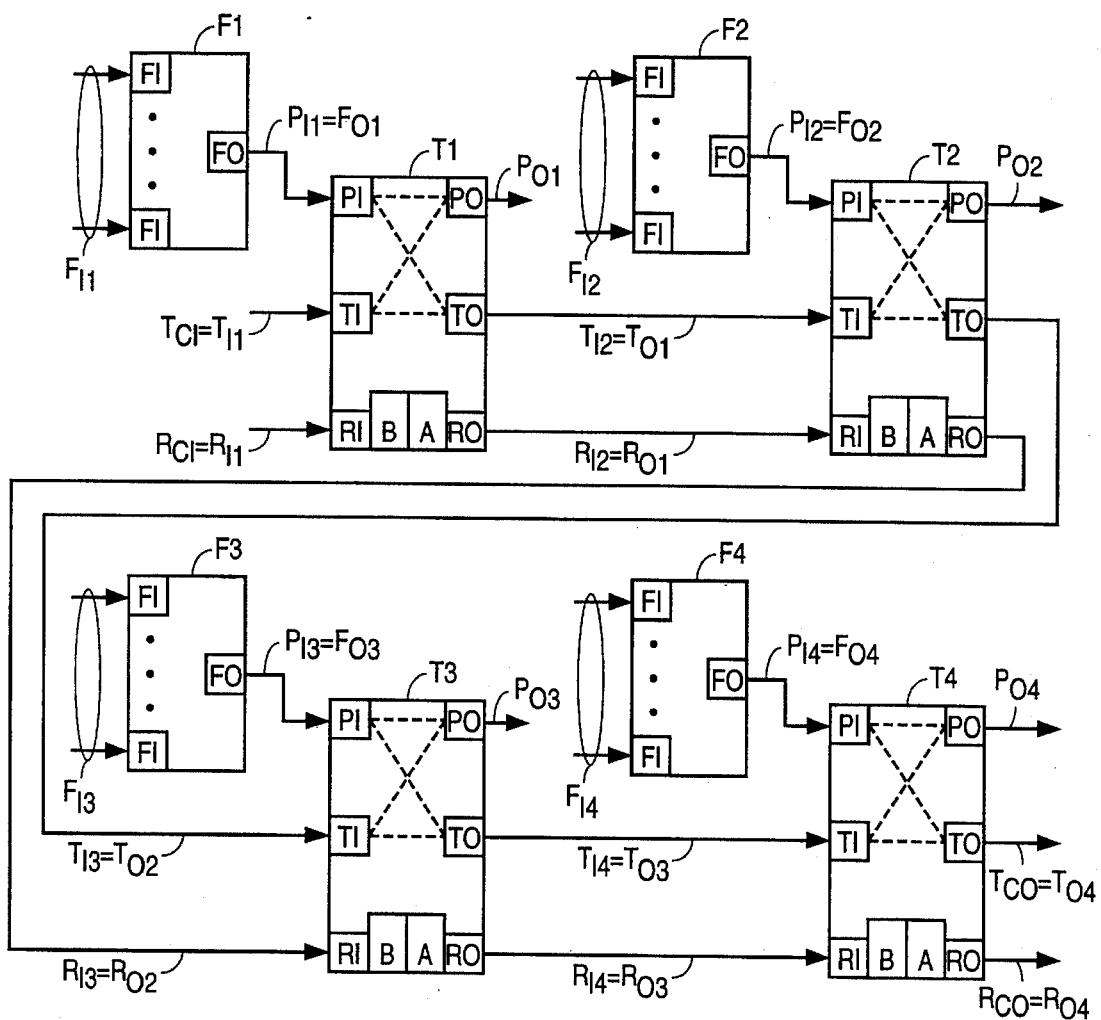
FIG. 1 is a block diagram of an electronic circuit configured to be internally testable according to the invention.

Reference symbols above the program code lines in FIGS. 4, 6, 10, 12, 14, 22, 26, 28, and 32 indicate the test elements associated with the indicated code portions. Reference symbols below the code lines in these figures indicate the shift-register bits.

Like reference symbols are employed in the drawings and in the description of the preferred embodiments to represent the same or very similar item or items.

DESCRIPTION OF THE PREFERRED EMBODIMENTS

In the following description, "0" means a low binary logic level. Similarly, "1" means a high binary logic level.

Referring to the drawings, FIG. 1 illustrates an electronic circuit that provides observability and real-time controllability for testing internal nodes of the circuit in accordance with the teachings of the invention. The circuit in FIG. 1 consists of functional circuitry and test circuitry. The functional circuitry performs the general function that the circuit is intended to implement.

The functional circuitry is formed with a number of functional elements indicated by reference symbols beginning with the letter "F". FIG. 1 depicts four such functional elements F1, F2, F3, and F4. However, the principles of the invention are applicable to any other plurality of such functional elements. The minimum number of functional elements is typically three. At least one of functional elements F1–F4 performs asynchronous combinational logic. The building blocks of functional elements F1–F4 include AND gate, OR gates, NAND gates, NOR gates, inverters, decoders, multiplexers, shifters, and flip-flops.

Each functional element Fj, where j is an integer running from 1 to 4, performs an electronic function on one or more function input signals $F_{Ij}$ supplied at one or more corresponding function inputs FI to produce a function output signal $F_{Oj}$ at a function output FO. Normally, there are at least two function input signals $F_{Ij}$ to each function element Fj. Certain of signals $F_{Ij}$ are input signals to the circuit of FIG. 1.

The test circuitry consists of a number of test elements (or cells) identified by reference symbols beginning with the letter "T". The number of test elements is the same as the number of functional elements, each test element corresponding to a different one of the functional elements. Thus, there are four test elements T1, T2, T3, and T4 in the circuit of FIG. 1.

Each test element Tj, where j again is an integer running from 1 to 4, has a primary input PI, a primary output PO, a test input TI, a test output TO, a register input RI, and a register output RO. A primary input signal $P_{Ij}$, a test input signal $T_{Ij}$, and a register input signal $R_{Ij}$ are respectively supplied to inputs PI, TI, and RI of each test element Tj. A primary output signal $P_{Oj}$, a test output signal $T_{Oj}$, and a register output signal $R_{Oj}$ are respectively provided from outputs PO, TO, and RO of each test element Tj.

Function output FO of each functional element Fj is connected to primary input PI of corresponding test element Tj so that primary input signal $P_{Ij}$ is function output signal $F_{Oj}$. Typically, this is the only point outside of functional element Fj to which its function output FO is directly connected. Specifically, output FO of element Fj is not connected directly to the circuit node or nodes that, in the absence of test element Tj, would need to receive functional output signal $F_{Oj}$ in order to perform the intended circuit function.

One or more of primary output signals $P_{O1}$–$P_{O4}$ constitute output signals from the circuit of FIG. 1. Certain, usually at least two, of primary output signals $P_{O1}$–$P_{O4}$ constitute input signals to other parts of the circuit. Some of signals $P_{O1}$–$P_{O4}$ may serve both as circuit output signals and as input signals to other circuit elements. Although not shown in FIG. 1, each primary output signal $P_{Oj}$ is, in any case, always provided to the circuit node or nodes that corresponding function output signal $F_{Oj}$ would otherwise be supplied to implement the desired circuit function in the absence of test element Tj.

Test output TO of each test element Tj except the last one (element T4 here) is connected to input TI of the next test element Tj+1. Except for first test input signal $T_{I1}$ and last test output signal $T_{O4}$, each test output signal $T_{Oj}$ thereby is test input signal $T_{Ij+1}$. Signal $T_{I1}$ is circuit test input signal $T_{CI}$ supplied to the circuit at a circuit test input (not shown in FIG. 1). Signal $T_{O4}$ is observable test output signal $T_{CO}$ provided from the circuit at a circuit test output (also not shown in FIG. 1).

Similarly, register output RO of each test element Tj except the last one is connected to register input RI of next test element Tj+1. Except for first register input signal $R_{I1}$ and last register output signal $R_{O4}$, each register output signal $R_{Oj}$ is register input signal $R_{Ij+1}$. Signal $R_{I1}$ is circuit register input signal $R_{CI}$ provided to the circuit at a circuit register input (not shown in FIG. 1). Signal $R_{O4}$ is circuit register output signal $R_{CO}$ provided from the circuit at a circuit register output (also not shown in FIG. 1).

Each test element Tj contains a programmable section formed with a shift register that stores bits A and B in a pair of binary storage units, typically flip-flops. Register input signal $R_{Ij}$ is the data input signal to the "B" storage unit in element Tj of FIG. 1. Register output signal $R_{Oj}$ is the data output signal representing bit A in the "A" storage unit of element Tj.

A suitable test clock signal (not indicated in FIG. 1) is supplied to all the shift registers to control data shifting through them. During test operation, bits A and B for each test element Tj are shifted into its shift register in synchronism with (clock pulses of) the clock signal. Since register inputs RI and outputs RO are connected together in series, bits A and B are sequentially shifted into all the shift registers by appropriately adjusting the value of register input signal $R_{CI}$ before each clock pulse.

Figure 2A:
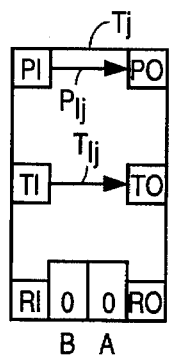
FIGS. 2a, 2b, and 2c are diagrams illustrating internal conditions programmable into each test element in the circuit FIG. 1.
Figure 2B:
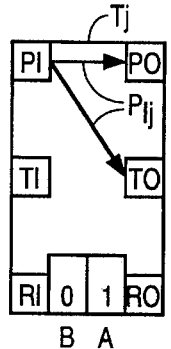
Figure 2C:
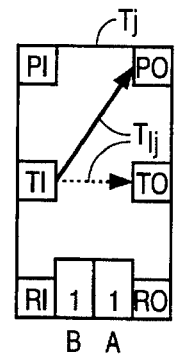

Within each test element Tj in the circuit of FIG. 1, input signals $P_{Ij}$ and $T_{Ij}$ are variously supplied to outputs PO and TO according to any of three internal conditions determined by the programming of bits A and B in the Tj shift register. FIGS. 2a–2c illustrate the three programmable internal conditions. In starting a test or in going from one test to another, each test element Tj can, as desired, be programmably switched from one of the internal conditions to either of the other two internal conditions.

Input signals $P_{Ij}$ and $T_{Ij}$ are respectively supplied asynchronously to outputs PO and TO of test element Tj in the internal condition shown in FIG. 2a. When element Tj is in this internal condition, element Tj is transparent to corresponding functional element Fj. Accordingly, the internal test-element condition shown in FIG. 2a is generally referred to as the transparent internal condition. In the exemplary programming shown for the transparent internal condition in FIG. 2a, bits A and B are both "0".

During normal circuit operation, input signals $P_{Ij}$ and $T_{Ij}$ in every test element Tj are respectively supplied to its outputs PO and TO. Accordingly, the test circuitry in the circuit is transparent to the functional circuitry. The transparency could be achieved by programming bits A and B in all the shift registers to have values (both "0" here) that implement the internal condition of FIG. 2a. Usually, however, a test-enable signal (not indicated in FIG. 1) is furnished to all test elements T1–T4 in the circuit. During normal circuit operation, the test-enable signal is set at a test-disable value which causes input signals $P_{Ij}$ and $T_{Ij}$ to be respectively supplied to outputs PO and TO in every element Tj regardless of the current values of bits A and B in the shift registers. In other words, the disable value of the test-enable signal overrides the shift-register programming.

In the internal condition shown in FIG. 2b, primary input signal $P_{Ij}$ in each test element $T_j$ is supplied asynchronously to both its primary output PO and its test output TO. Bits A and B now respectively have the exemplary values of "1" and "0". Output signal $F_{Oj}$ of corresponding functional element Fj is thereby again furnished to primary output PO of test element Tj. Accordingly, element Tj does not directly affect the function performed by element Fj. Inasmuch as function output signal $F_{Oj}$ is also supplied to test output TO of test element Tj, signal $F_{Oj}$ can be observed in real time at the $T_O$ circuit output provided that each subsequent test element Tj, if any, in the test-element chain is programmed to be in the transparent condition of FIG. 2a.

Figure 3:
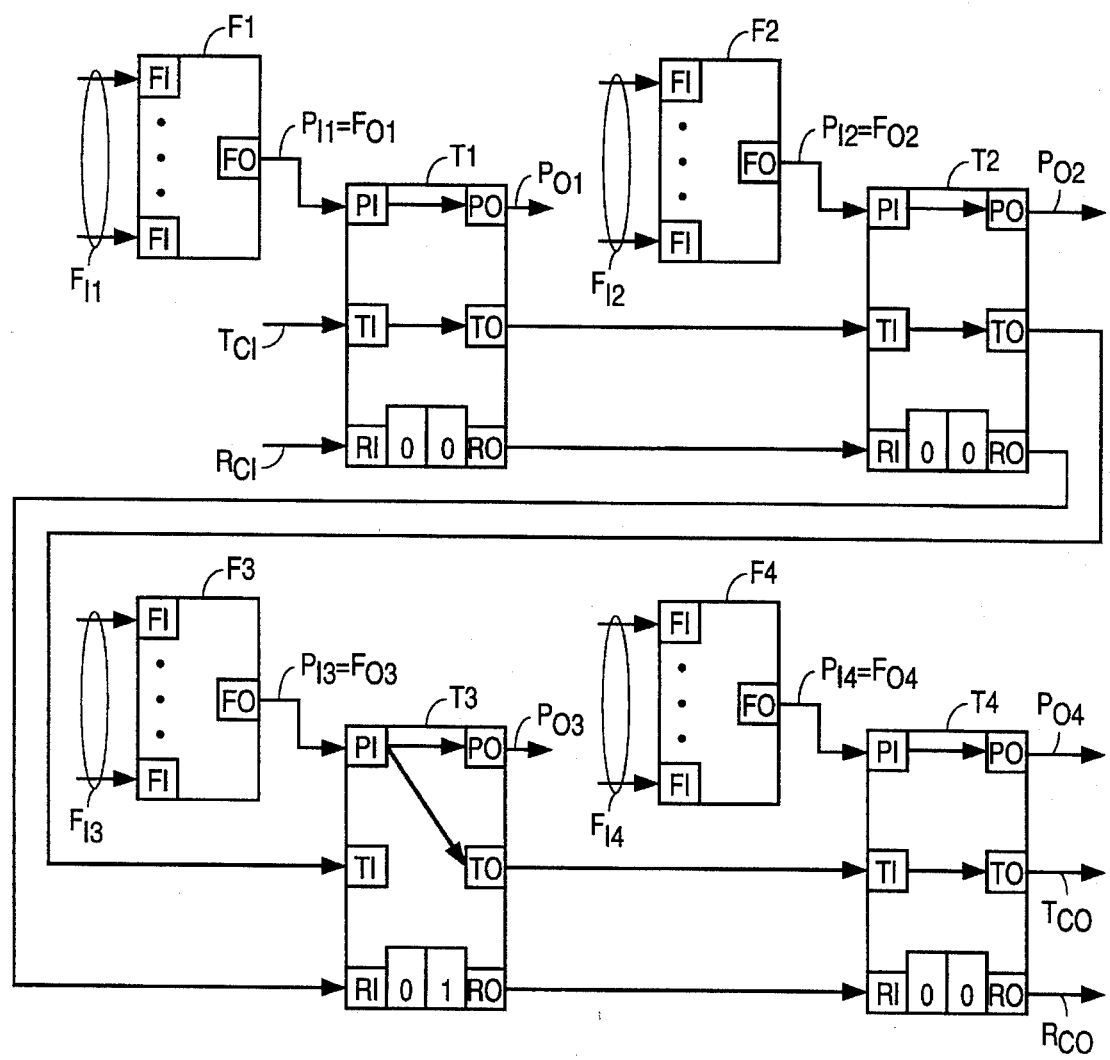
FIGS. 3 and 5 are block diagrams that demonstrate typical programming of the circuit in FIG. 1.
Figure 4:
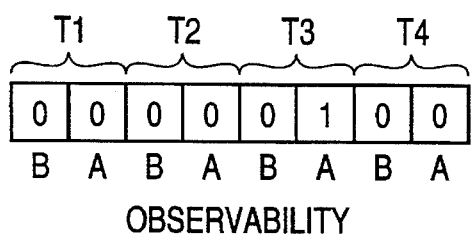
FIGS. 4 and 6 are diagrams of the program codes used respectively in FIGS. 3 and 5.

FIG. 3 presents an example of how function output signal $F_{Oj}$ from one of functional elements F1–F4 is observable. In the illustrated example, test element T3 is programmed to be in the observability internal condition. Test element T4 is placed in the transparent internal condition. As a result, function output signal $F_{O3}$ is observable in real time at the $T_{CO}$ circuit output. Test elements T1 and T2 are also placed in the transparent internal condition so that only observability occurs in the example of FIG. 3. FIG. 4 illustrates the program code clocked into the shift registers through the $R_{CI}$ circuit input to achieve the observability programming of FIG. 3.

Turning back to FIG. 2c, it depicts an internal condition in which test input signal $T_{Ij}$ is furnished asynchronously to primary output TO of test element Tj. Primary output $T_{Oj}$ then follows circuit test input signal $T_{CI}$ so as to achieve real-time controllability provided that each, if any, earlier test element Tk in the test-element chain is programmed to be in the transparent condition of FIG. 2a. Here, k is an integer that differs from j. When circuit test input signal $T_{CI}$ changes value, primary output $T_{Oj}$ changes value at a correspondingly later time dependent on the intervening signal transmission delays. In the real-time controllability internal condition of FIG. 2c, test input signal $T_{ij}$ may optionally also be supplied to test output TO of element Tj. Bits A and B are both "1" in the exemplary programming shown for the real-time controllability internal condition.

Real-time controllability is usually combined with observability through the $T_{CO}$ circuit output. With one test element Tj programmed to be in the real-time controllability condition, circuit test output observability is achieved by programming an appropriate later test element Tk in the test-element chain to be in the observability condition of FIG. 2b. Later element Tk is a test element whose functional element Fk receives real-time controlled primary output signal $P_{Oj}$ as an $F_{Ik}$ input signal. Each of test elements T1–T4, if any, that follows observability programmed test element Tk is placed in the transparent internal condition of FIG. 2a.

Figure 5:
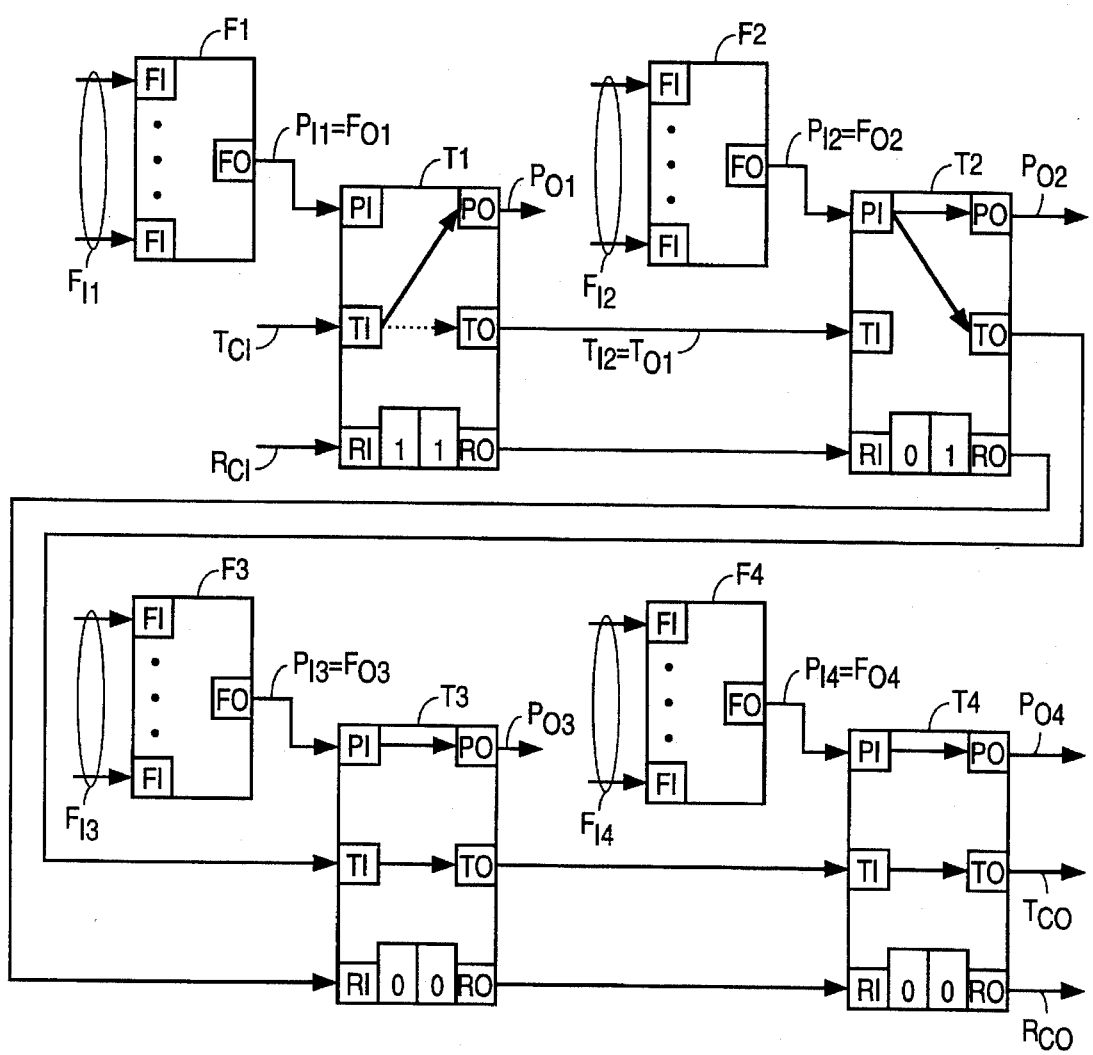
Figure 6:
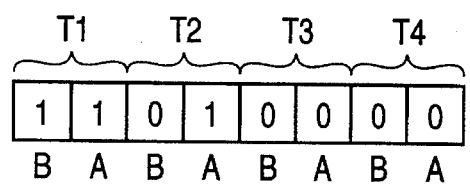

FIG. 5 presents an example of how real-time controllability is typically combined with $T_{CO}$ circuit output observability in the circuit of FIG. 1. In this example, primary output signal $P_{O1}$ constitutes an $F_{I2}$ input signal to functional element F2. Signal $P_{O1}$ is real-time controlled by placing test element T1 in the real-time controllability condition of FIG. 2c. Test element T2 is placed in the observability internal condition. As a consequence, circuit test input signal $T_{CI}$ replaces functional output signal $F_{O1}$ as an input signal to functional element F2. Test elements T3 and T4 are placed at the transparent internal condition. The effect of exerting real-time control on functional element F2 in this way is observable in real time at the $T_{CO}$ circuit output. FIG. 6 illustrates the associated program code clocked into the shift registers through the $R_{CI}$ circuit input.

FIG. 7 illustrates an extension of the circuit of FIG. 1 to include state controllability for testing internal circuit nodes in accordance with the invention. As in FIG. 1, the circuit of FIG. 7 contains functional circuitry and test circuitry. The functional circuitry again consists of four functional elements F1–F4, at least one of which performs asynchronous combinational logic. Within the circuit, functional elements F1–F4 in FIG. 7 are connected in the same manner as in FIG. 1.

The test circuitry in FIG. 7 is formed with four test elements T1–T4. As in FIG. 1, each test element Tj in FIG. 7 receives input signals $P_{Ij}$, $T_{Ij}$, and $R_{Ij}$ at respective inputs PI, TI, and RI, and supplies output signals $P_{Oj}$, $T_{Oj}$, and $R_{Oj}$ at respective outputs PO, TO, and RO. Each primary input signal $P_{Ij}$ again is function output signal $F_{Oj}$ from corresponding functional element Fj. Similarly, although not shown in FIG. 7, each function output signal $P_{Oj}$ is provided to the circuit node or nodes that function output signal $F_{Oj}$ would otherwise be provided to implement the desired circuit function in the absence of test element Tj.

Each test element Tj in FIG. 7 contains a programmable section implemented with a shift register that stores bits A and B in the manner described above. The shift register in each element Tj also stores a bit S in a further binary storage unit, likewise typically a flip-flop. The "S" storage unit in element Tj provides an internal storage signal $S_j$ indicative of the value of bit S.

Each test element Tj can be placed in any one of four internal conditions by appropriately programming bits A and B in the Tj shift register. FIGS. 8a–8d illustrate the four programmable internal conditions. As in FIG. 1, each test element Tj in FIG. 4 can be programmably switched to (a) a transparent internal condition in which input signals $P_{Ij}$ and $T_{Ij}$ are respectively supplied asynchronously to outputs PO and TO, (b) an observability internal condition in which primary input signal $P_{Ij}$ is supplied asynchronously to outputs PO and TO, and (c) a real-time controllability internal condition in which test input signal $T_{Ij}$ is supplied asynchronously to primary output PO and optionally to test output TO. These three conditions are respectively shown in FIGS. 8a–8c which, except for the presence of bit S in element Tj, are respectively the same as FIGS. 2a–2c.

FIG. 8d depicts the fourth internal condition in which state controllability is attained by asynchronously furnishing storage signal $S_j$ and test input signal $T_{Ij}$ of test element Tj respectively to outputs PO and TO of element Tj. Primary output signal $P_{Oj}$ is then fixed at the value of storage signal $S_j$ regardless of the value of primary input signal $P_{Ij}$. Bits A and B respectively have "0" and "1" values in the exemplary programming for the state controllability condition in FIG. 8d.

State controllability is usually combined with observability through the $T_{CO}$ circuit output and often also with real-time controllability. When observability and state controllability, but not real-time controllability, are present in the circuit, an appropriate test element Tk that follows state controlled test element Tj in the test element chain is programmed to be in the observability condition of FIG. 8b. Observability programmed element Tk is a test element whose corresponding functional element Fk receives state controlled primary output signal $P_{Oj}$ as an $F_{Ik}$ input signal. As with real-time controllability, each test element Tj that follows observability programmed element Tk is placed in the transparent internal condition of FIG. 8a.

Figure 9:
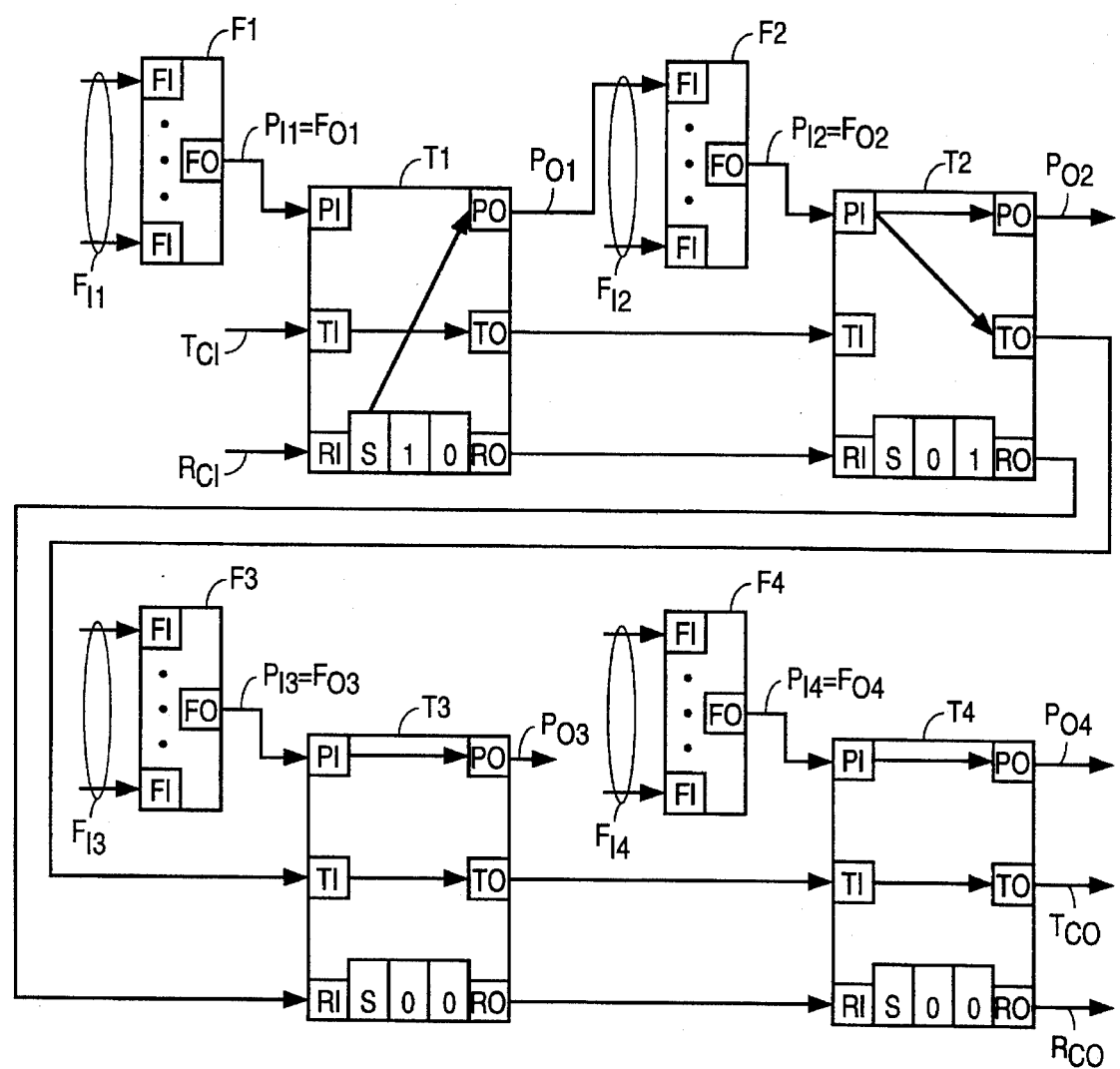
FIGS. 9, 11, and 13 are block diagrams that demonstrate typical programming of the circuit in FIG. 7.

FIG. 9 presents an example of how state controllability and $T_{CO}$ circuit output observability are combined in the circuit of FIG. 7. In this example, primary output signal $P_{O1}$ constitutes an $F_{I2}$ input signal to functional element F2. Test element T1 is placed in the state controllability condition of FIG. 8d. Accordingly, the above-mentioned input signal to element F2 is fixed at the value of bit S in the T1 shift register during test.

Figure 10:
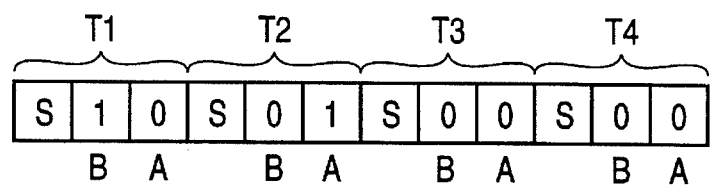
FIGS. 10, 12, and 14 are diagrams of the program codes used respectively in FIGS. 9, 11, and 13.

In FIG. 9, test element T2 is placed in the observability condition of FIG. 8b. Test elements T3 and T4 are placed at the transparent internal condition. The effect of providing functional element F2 with a state controlled $F_{I2}$ input by way of test element T1 is observable in real time at the $T_{CO}$ circuit output. FIG. 10 illustrates the program code clocked into the shift registers through the $R_{CI}$ circuit input to achieve the observability/state controllability programming of FIG. 9.

When state controllability is combined with both circuit test output observability and real-time controllability, relatively complex test operations can be performed. For example, one $F_{Ij}$ input signal of a functional element Fj can be state controlled while another $F_{Ij}$ input signal of the same functional element Fj is real-time controlled.

Figure 11:
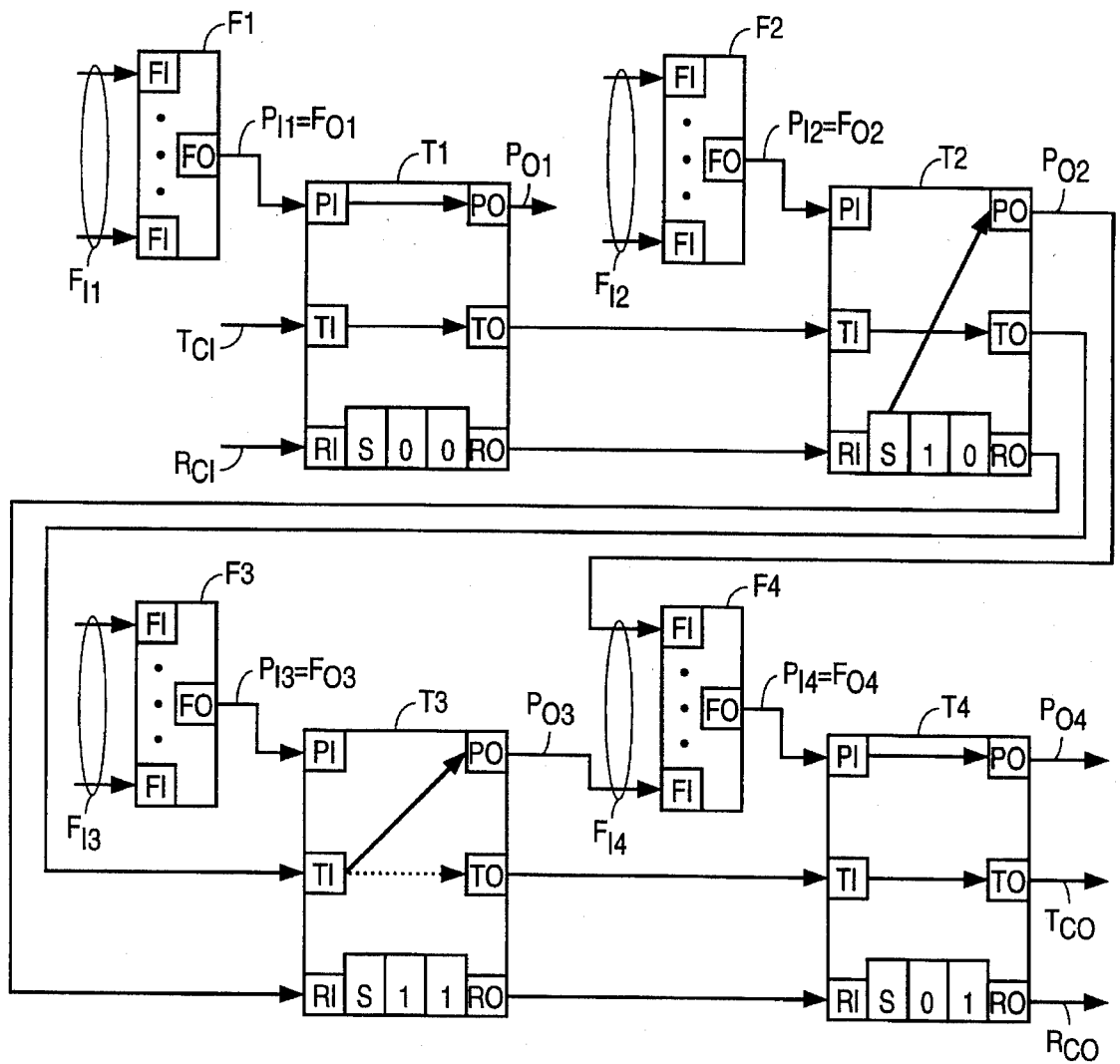

FIG. 11 presents an example of how state controllability is combined with real-time controllability and $T_{CO}$ circuit output observability in the circuit of FIG. 7. In the illustrated example, primary output signals $P_{O2}$ and $P_{O3}$ both constitute input signals to functional element F4. Output signal $P_{O2}$ is state controlled by placing test element T2 in the internal condition of FIG. 8d. Output signal $P_{O3}$ is real-time controlled by placing test element T3 in the internal condition of FIG. 8c.

Figure 12:
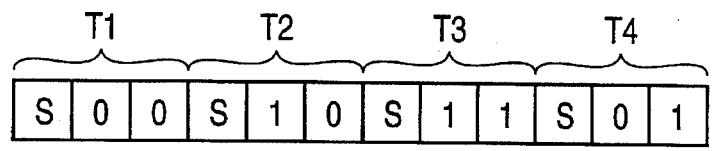

In the example of FIG. 11, test element T1 is placed in the transparent internal condition of FIG. 8a. Finally, test element T4 is placed in the observability condition of FIG. 8b. The effect of performing state and real-time controllability on functional F4 is then observable in real time at the $T_{CO}$ circuit output. FIG. 12 illustrates the associated program code clocked into the shift registers.

State controllability or/and real-time controllability can be utilized without observability through the $T_{CO}$ circuit output. In such a case, the effect of state or/and real-time controllability is typically observed at one or more primary outputs PO that also constitute circuit outputs.

Figure 13:
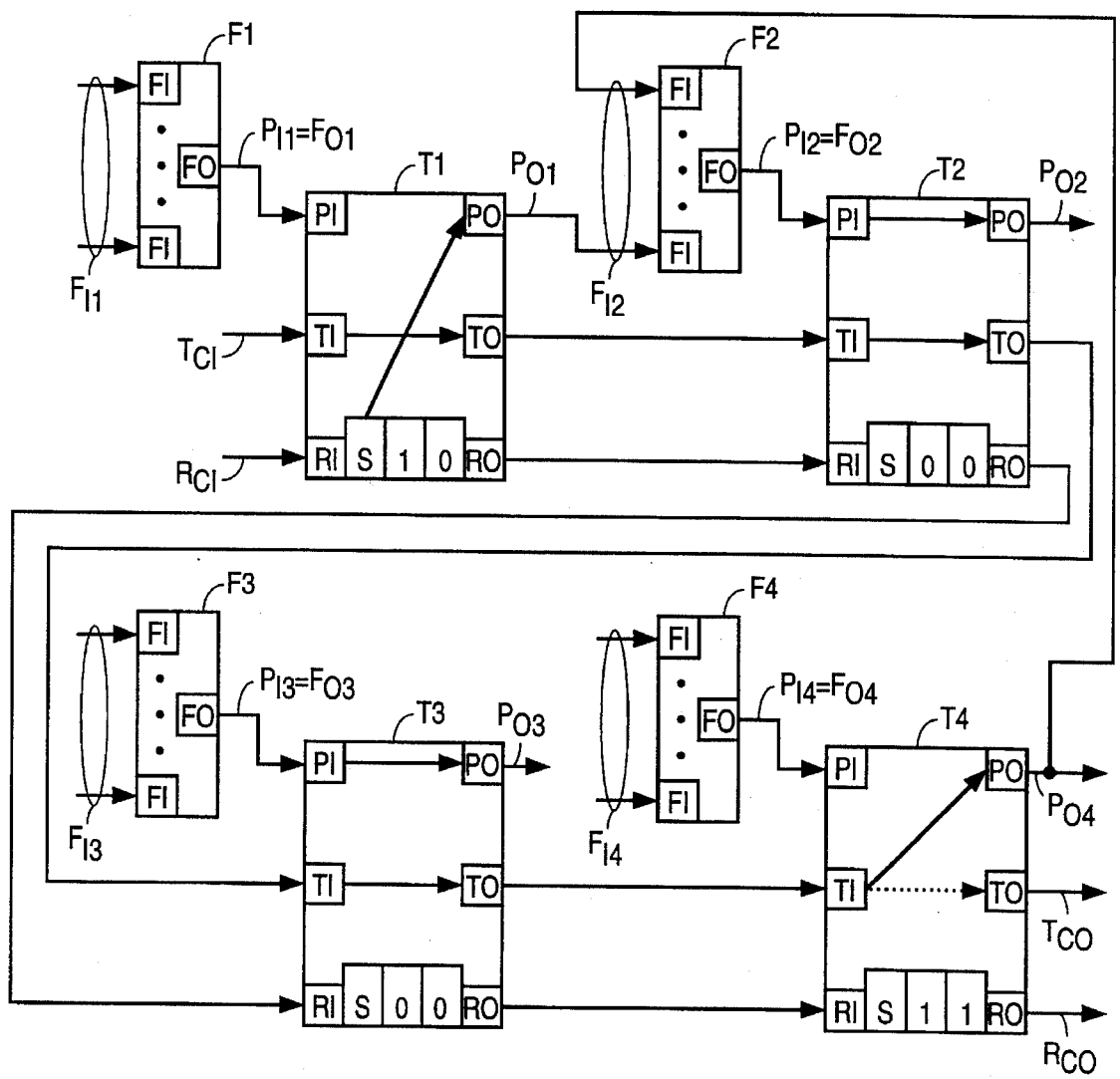
Figure 14:
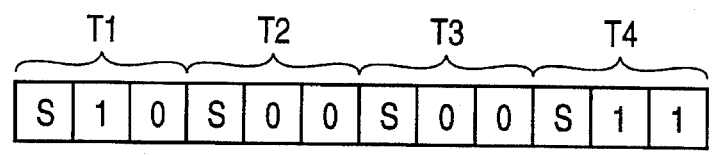

FIG. 13 presents an example in which state and real-time controllability, but not circuit test output observability, are present. In this example, primary output signals $P_{O1}$ and $P_{O4}$ are input signals to functional element F2. Test element T2 is placed in the state controllability internal condition, while test elements T2 and T3 is placed in the transparent internal condition. Test element T4 is placed in the real-time controllability internal condition. None of test elements T1–T4 is placed in the observability internal condition. However, primary output signal $P_{O4}$ is a circuit output signal that, by using appropriate test equipment, can be observed. FIG. 14 shows the program code for the example of FIG. 13.

The circuits of FIGS. 1 and 7 are tested in the following way. Program data suitable for placing each test element Tj in a selected one of the internal conditions available to the circuit is appropriately shifted into the Tj shift registers through $R_{CI}$ circuit input. Depending on any program data already present in the shift registers, the programming step entails either entering a complete set of program data into the circuit or entering a partial set of program data into the circuit while shifting program data in one or more of test elements Tj down the test-element chain to one or more later elements Tk to complete the programming. For the circuit of FIG. 7, the programming step includes shifting appropriate test data into storage units S of test elements T1–T4.

The test-enable signal, which has a test-enable value and a test-disable value, is switched to the test-enable value to enable circuit testing. This is usually done after the programming step in order to avoid having the programming of the shift registers cause undesirable changes of state in any asynchronous state elements contained in functional elements F1–F4. When the test-enable signal is at the test-enable value and the programming step is complete, the circuit is ready for test. Each test element Tj in FIG. 1 is at one of the three internal conditions shown in FIGS. 2a–2c. Each test element Tj in FIG. 7 is at one of the four internal conditions shown in FIGS. 8a–8d.

A suitable data pattern, which may vary with time, is applied to the functional circuit inputs to exercise the circuit. Appropriate test data is simultaneously applied to the $T_{CI}$ circuit input. Except when the observability internal condition is not used, the results of exercising a circuit are normally observable at the $T_{CO}$ circuit output in real time. As noted above, the results may (depending on the test equipment) also be observable at the functional circuit outputs. The program data in the shift registers is subsequently checked by shifting the program data out of the circuit through the $R_{CO}$ circuit output. This may be done all at once or in a piece-meal manner when some of the program data is to be shifted down the test-element chain for a later test.

The circuits of FIGS. 1 and 7 can be simplified in various ways. For example, in an application where circuit test output observability is needed but not (real-time or state) controllability, the "B" storage unit and the circuitry that implements real-time controllability can be deleted in each test element Tj in the circuit of FIG. 1. In each element Tj, bit A determines whether element Tj is in the transparent condition or the observability condition.

Alternatively, real-time controllability may be needed in certain applications but not state controllability or observability through the $T_{CO}$ circuit output. In such applications, bits A and B in each test element Tj of the circuit in FIG. 1 can be replaced with a single bit that controls switching between the transparent internal condition and the real-time controllability condition. The circuitry that implements $T_{CO}$ circuit output observability is deleted in each element Tj. Tests are performed with equipment that permits the test results to be observable at the functional circuit outputs.

Similarly, state controllability may be needed in some applications but not real-time controllability or circuit test output observability. In the circuit of FIG. 7, bits A and B in each test element Tj can be replaced with a single bit that controls switching between the transparent internal condition and the state controllability condition. The circuitry that implements real-time controllability and observability through the $T_{CO}$ circuit output is deleted in each test element Tj of FIG. 7. Again, test equipment is used that permits the test results to be observed at the functional circuit outputs.

Finally, some applications may require real-time and state controllability but not observability through the $T_{CO}$ circuit output. In the circuit of FIG. 7, the circuitry that implements $T_{CO}$ circuit output observability is deleted in each test element Tj. The functional circuit outputs are used to observe test results.

Figure 15:
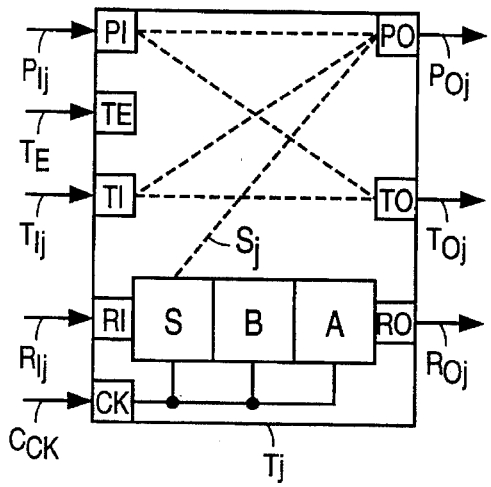
FIG. 15 is a more detailed diagram illustrating the internal configuration of each test element in FIG. 7.

As mentioned above, each test element Tj receives a test-enable signal and a test clock signal. FIG. 15 illustrates element Tj in more detail where test clock signal $C_{CK}$ is supplied through a clock input CK to the "A", "B", and "S" storage units in the Tj shift register. Element Tj in FIG. 15 receives test-enable signal $T_E$ at a test-enable input TE.

The circuitry that variously provides signals $P_{Ij}$, $T_{Ij}$, and $S_j$ to outputs PO and TO in each test element $T_j$ consists of asynchronous logic elements arranged in a variety of ways. The asynchronous logic elements include AND gates, OR gates, NAND gates, NOR gates, and inverters, as well as asynchronous combinations of these elements.

Figure 16:
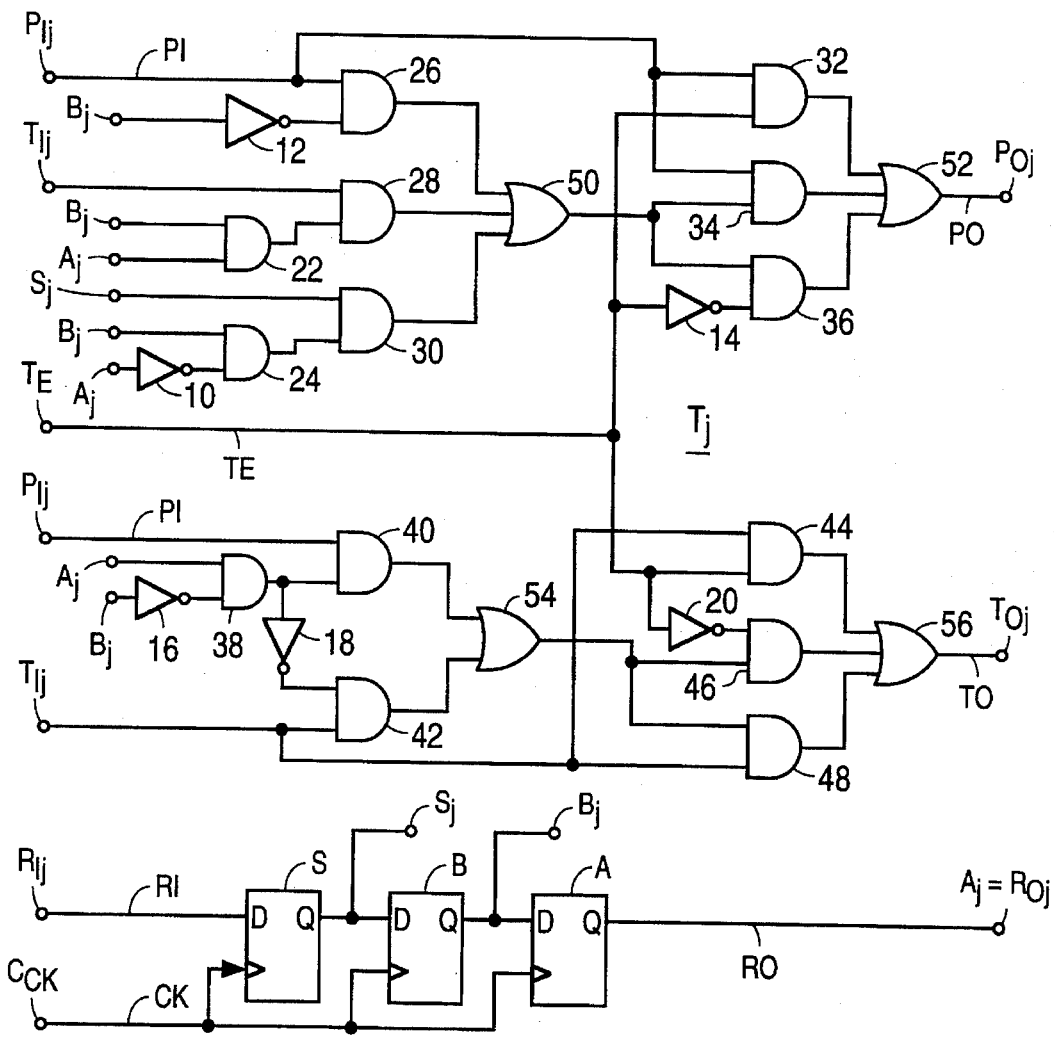
FIG. 16 is a logic diagram of typical circuitry that implements each test element in FIG. 15.

An example of logic gates and flip-flops that can be used to implement each test element Tj is shown in FIG. 16. In this example, element Tj consists of inverters 10, 12, 14, 16, 18, and 20, AND gates 22, 24, 26, 28, 30, 32, 34, 36, 38, 40, 42, 44, 46, and 48, and OR gates 50, 52, 54, and 56, along with the "A", "B", and "S" storage units, all interconnected as shown. The "A", "B", and "S" storage units are D-type flip-flops. The "A" storage unit provides an output signal $A_j$ which is register output $R_{Oj}$. The "B" storage unit provides an output signal $B_{Oj}$. The implementation of FIG. 16 generates output signals $P_{Oj}$ and $T_{Oj}$ along redundant paths, commonly called hazardous design, in response to signals $P_{Ij}$, $T_{Ij}$, $T_E$, $A_j$, $B_j$, and $S_j$ so that signals $P_{Oj}$ and $T_{Oj}$ are furnished at the desired values even when one of the paths is inoperative.

Figure 17:
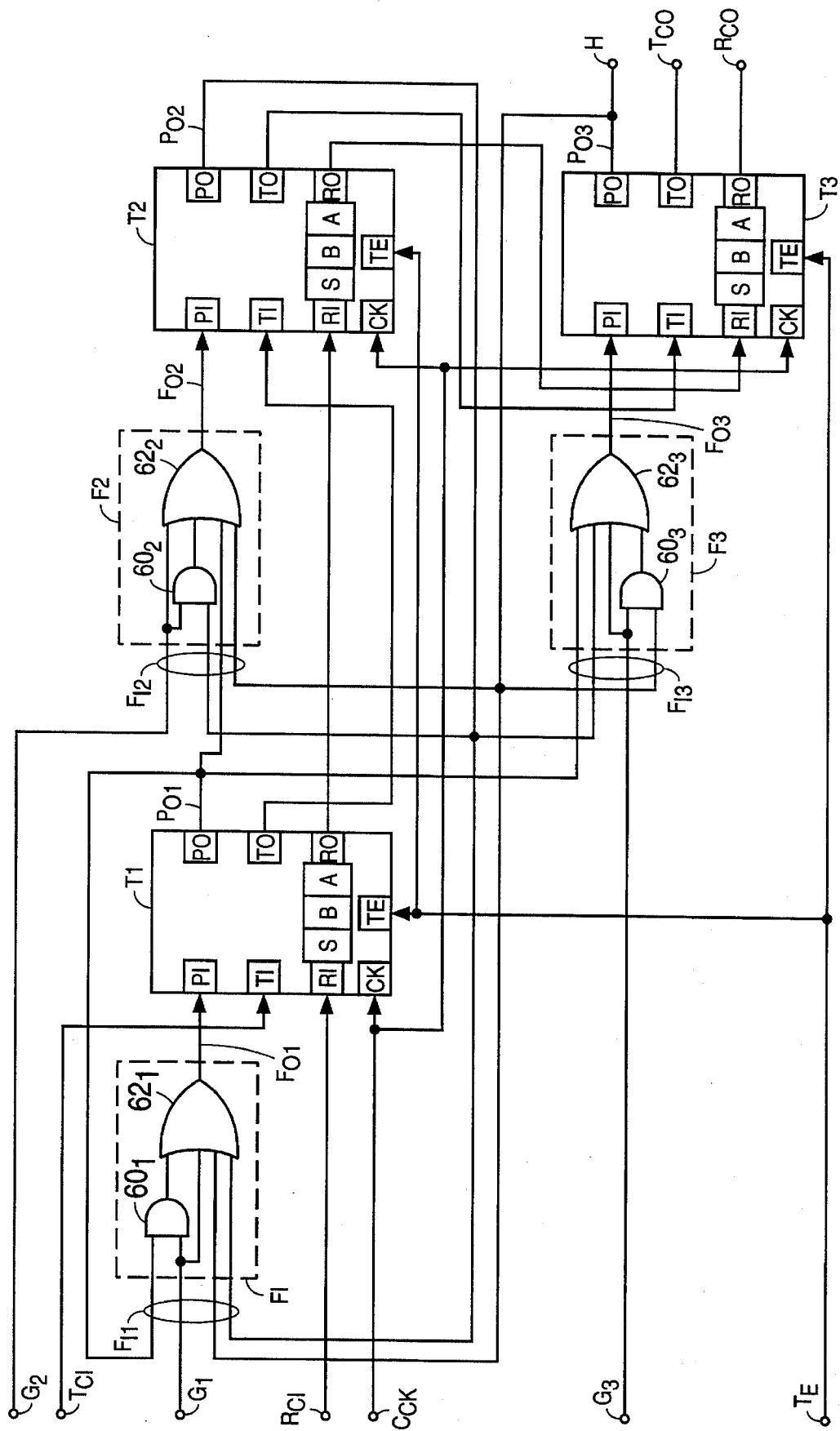
FIG. 17 is a logic diagram of an exemplary IC implementation of the circuit of FIG. 7.

FIG. 17 illustrates an example of the complete circuit interconnections for the circuit of FIG. 7 when the circuit is implemented as a single IC. The implementation of FIG. 17 contains three asynchronous functional elements F1–F3. Each functional element Fj consists of an AND gate $60_j$ and an OR gate $62_j$.

The IC in FIG. 17 has input pins for receiving functional input signals G1, G2, and G3, circuit test input signal $T_{CI}$, circuit register input signal $R_{CI}$, test clock signal $C_{CK}$, and test-enable signal $T_E$. Signals $G_1$–$G_3$ are respectively supplied to elements F1–F3 as part of their input signals. The IC has output pins for providing functional output signal H, circuit test output signal $T_{CO}$, and circuit register output signal $R_{CO}$. Primary output signal $P_{O3}$ is circuit output signal H in this example.

Primary output signal $P_{Oj}$ of each test element $T_j$ in FIG. 17 is fed back as one of the $F_{Ij}$ input signals to corresponding functional element Fj in order to provide element Fj with asynchronous capability to store data. Each output signal $P_{Oj}$ is also supplied as an $F_{Ij}$ input signal to the other two functional elements Fj. The resulting logic structure is relatively complex. Nevertheless, this complexity does not create any significant difficulty in applying the teachings of the invention to test the IC of FIG. 17.

Figure 18:
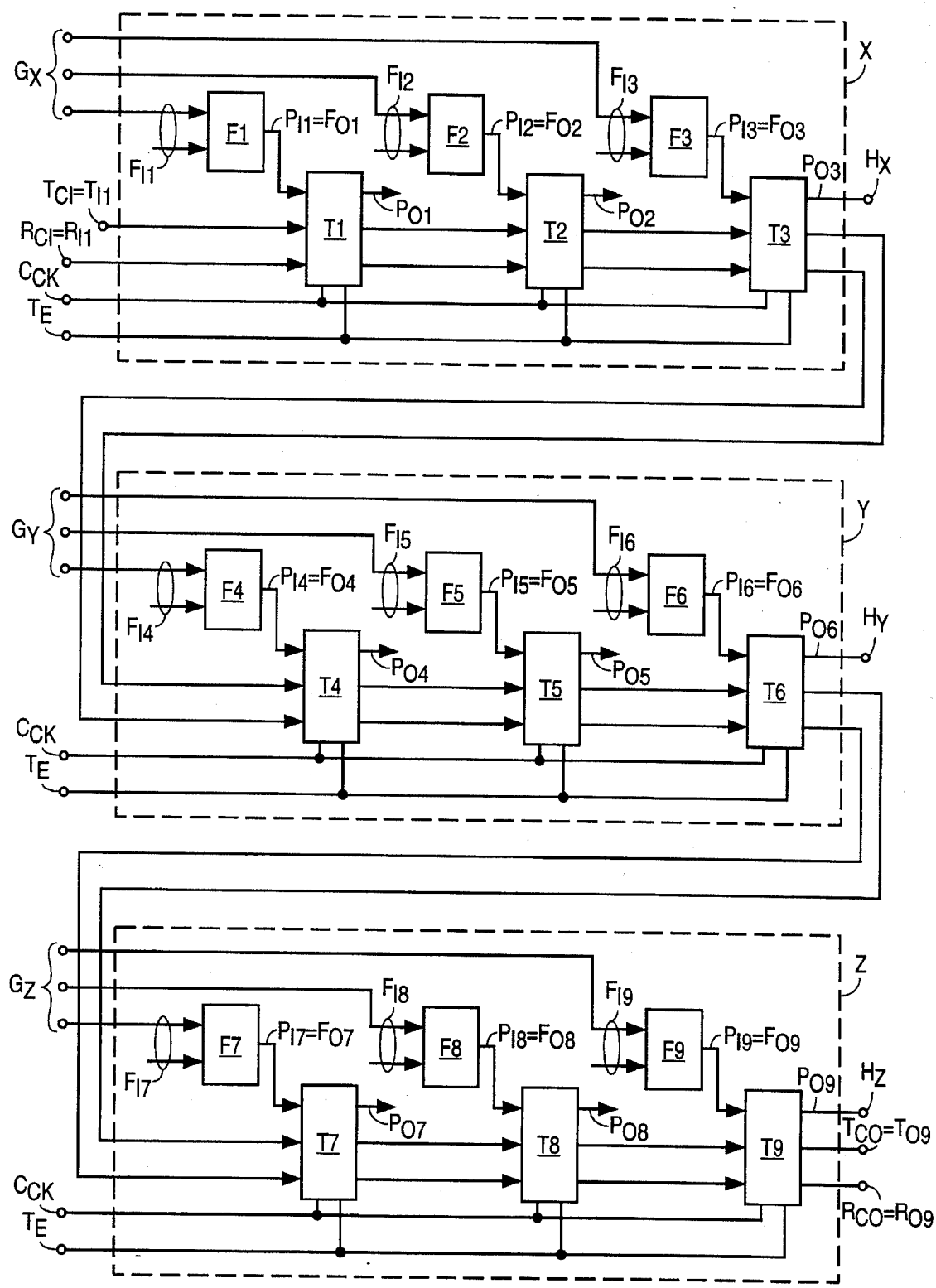
FIG. 18 is a block diagram of a set of three ICs configured to be testable according to the invention.

The observability, real-time controllability, and state controllability of the invention can be implemented across a number of ICs. FIG. 18 depicts an example in which the circuit of FIG. 1 or 7, as expanded to include nine functional elements Fj and nine corresponding test elements Tj, is implemented across three ICs X, Y, and Z. Signal groups $G_x$, $G_y$, and $G_z$ respectively constitute functional input signals to ICs X–Z. Signals $H_x$, $H_y$, and $H_z$ are functional output signals from ICs X–Z. Typically, ICs X–Z are mounted on a printed circuit board (not shown).

In some ICs, the interconnections among the elements of the functional circuitry are of such a nature that it would be difficult to completely test the internal circuit nodes using the test scheme of FIG. 1 or 7. In particular, complete tests may require that test input signal $T_{Ij}$ of the last test element Tj (element T4 in FIG. 1 or 7) be supplied to its primary output PO, thereby preventing test input TI of last test element Tj from being coupled to its test output TO. As a result, the $T_{CO}$ circuit output could not be used to observe certain internal nodes.

Figure 19:
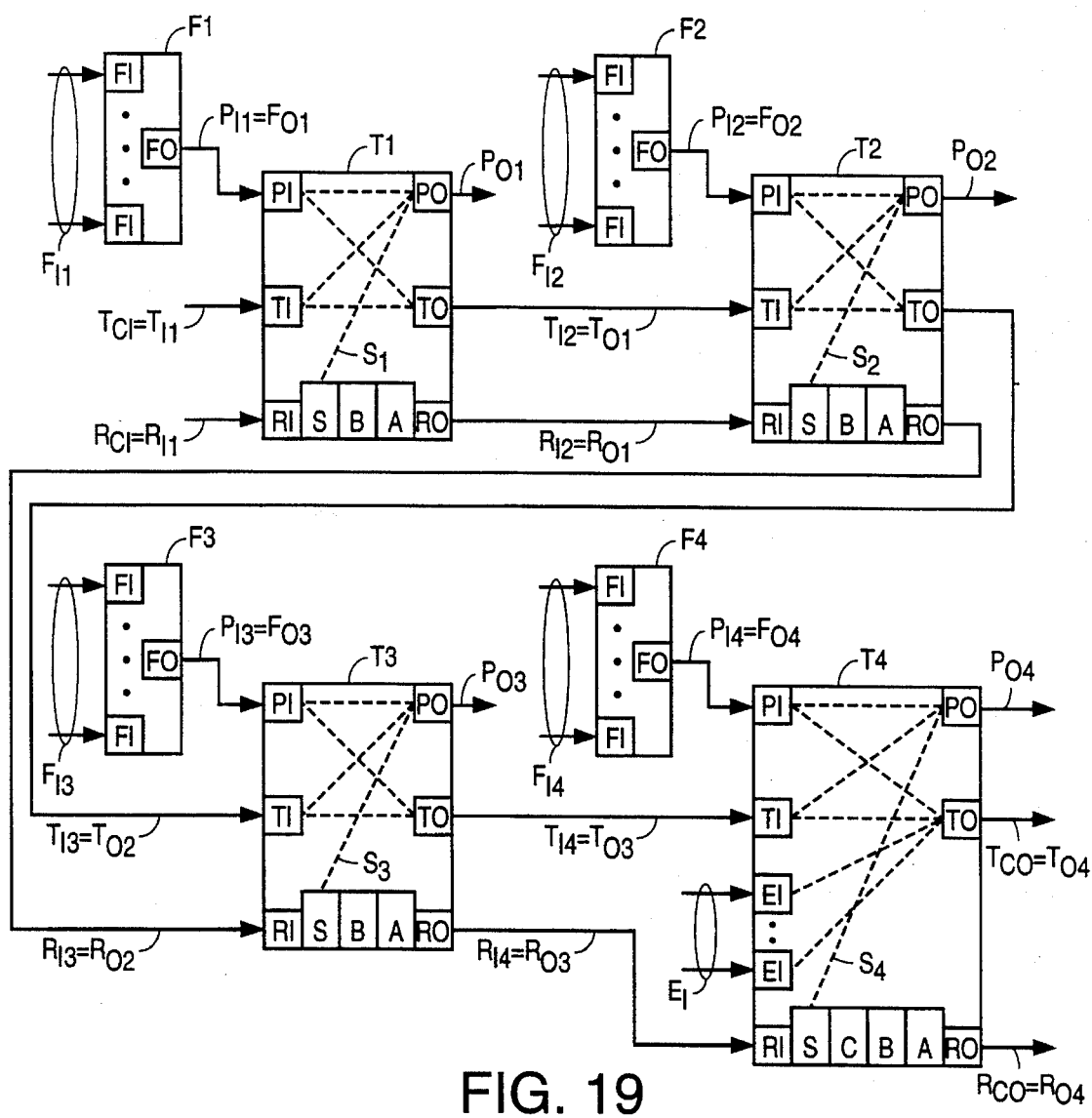
FIG. 19 is a block diagram of a further electronic circuit configured to be internally testable according to the invention.

Such a situation typically arises when primary output signal $P_{Oj}$ of last test element $T_j$ constitutes an input signal to a functional element Fk corresponding to an earlier test element Tk in the test-element chain and, for complete test, it is necessary to control functional element Fk by exerting real-time controllability through last test element Tj so that its primary output PO receives its test input signal $T_{Ij}$. FIG. 19 illustrates an extension of FIG. 7 that solves this problem in accordance with the invention.

The internally testable circuit in FIG. 19 contains functional circuitry and test circuitry. As in FIG. 7 the functional circuitry in FIG. 9 consists of functional elements F1–F4, at least one of which performs asynchronous combinational logic. The test circuitry in FIG. 9 is formed with test elements T1–T4 connected in series by way of test inputs TI and test inputs TO in the same way as in the circuit of FIG. 7. Each test element Tj in FIG. 19 also has all the capabilities of like-numbered element Tj in FIG. 7.

In addition, test element T4, the last element Tj in the test-element chain, has one or more extra inputs EI to which one or more corresponding extra input signals $E_I$ are supplied. If there is only one extra input signal $E_I$, element T4 can be programmably switched to an internal condition in which signal EI is provided to output TO of element T4. If there are two or more extra input signals $E_I$, element T4 can be programmably switched to an internal condition in which a selected one of signals $E_I$ is provided to output TO. In either case, test input signal $T_{I4}$ is simultaneously furnished to output PO in element T4.

Although not shown in FIG. 19, each extra input signal $E_I$ is normally output signal $P_{Oj}$ or $T_{Oj}$ from a test element Tj other than test element T4. When test input signal $T_{I4}$ is provided to primary output PO of element T4 during a test, switching to the extra internal condition enables output signal $P_{Oj}$ or $T_{Oj}$ of the other test element Tj to be observable in real time through the $T_{CO}$ circuit output.

Selection of the extra internal condition is accomplished by providing the T4 shift register with one or more additional binary storage units, typically flip-flops, for storing one or more additional bits. A maximum of four extra input signals $E_I$ can be accommodated with one extra bit. This is the case illustrated in FIG. 19 where a bit C is stored in the T4 shift register. Bit C is "1" during the extra internal condition and "0" during the other internal conditions.

Figures 20A, 20B, 20C, 20D:
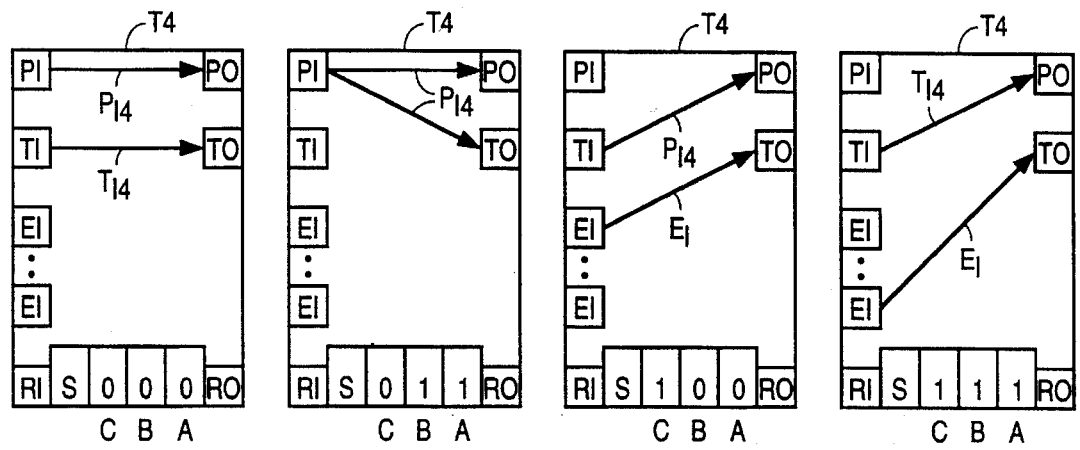
FIGS. 20a, 20b, 20c, and 20d are diagrams illustrating part of the internal conditions programmable into the last test element in the circuit of FIG. 19.

FIGS. 20a–20d illustrate part of the programmable internal conditions into which last test element T4 can be placed when there is one extra bit C. FIGS. 20a and 20b show the T4 transparent and observability internal conditions corresponding to FIGS. 8a and 8b. FIGS. 20c and 20d illustrate the extra internal condition in which bits A and B are used to determine which extra input signal $E_I$ is actually provided to test output TO of element T4.

Figure 21:
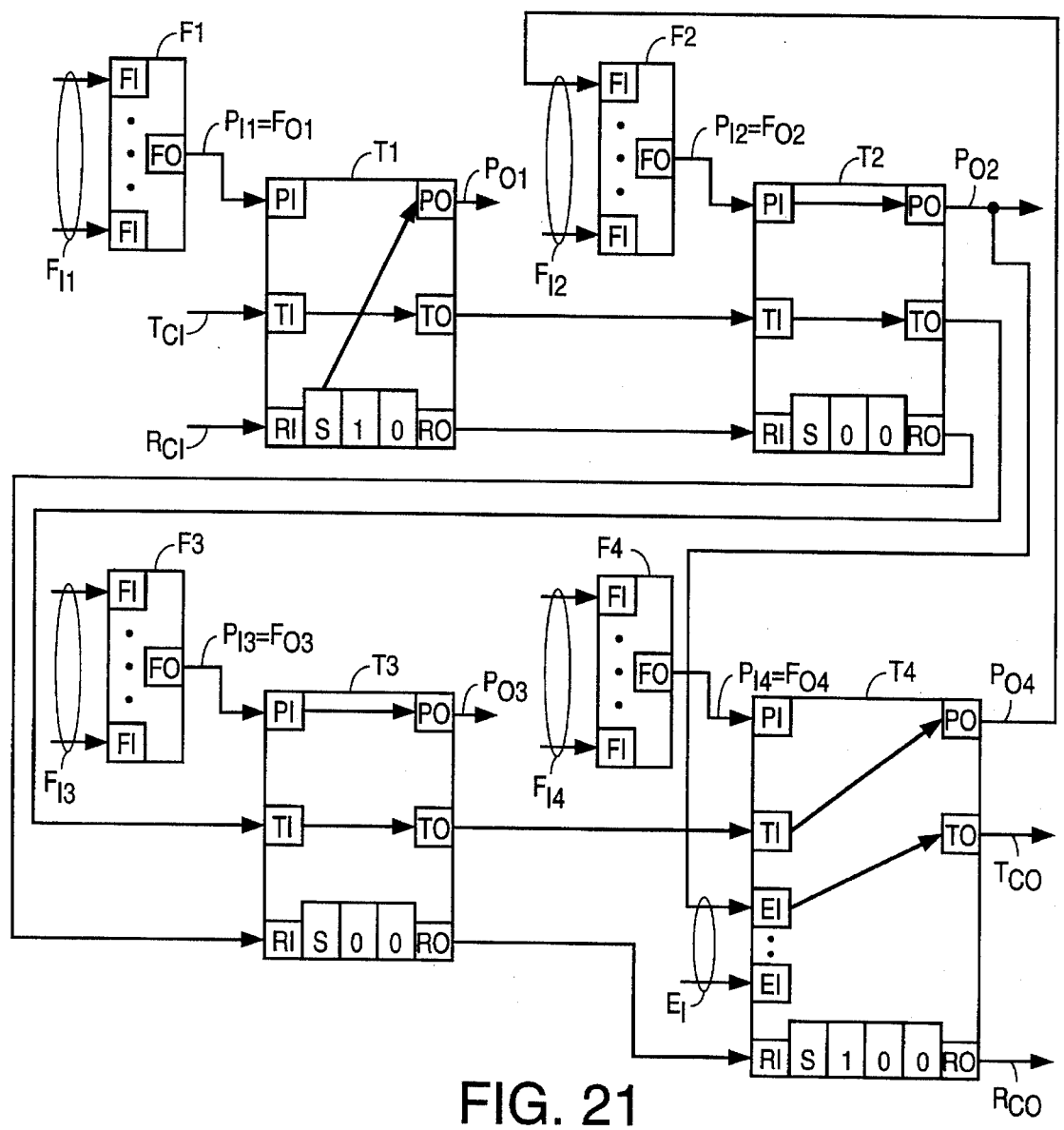
FIG. 21 is a block diagram that demonstrates typical programming of the circuit in FIG. 19.
Figure 22:
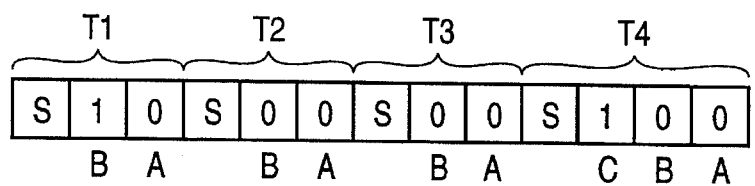
FIG. 22 is a diagram of the program code used in FIG. 21.

FIG. 21 presents a programmed example of the circuit of FIG. 19 in which test element T4 is placed in the extra internal condition in order to observe primary output signal $P_{O2}$ which is supplied to one of extra inputs EI. Primary output signal $P_{O4}$ is an input signal to functional element F2 in this example. Test element T1 is in the state controllability condition. Test elements T2 and T3 are in the transparent condition. With the test circuitry programmed as shown in FIG. 21, real-time test data supplied through the $T_{CI}$ circuit input and through test elements T1–T3 to test input TI of last test element T4 is used to control functional element F2 corresponding to earlier test element T2 while test output TO of element T4 is available to enable signal $P_{O2}$ to be observed in real time at the $T_{CO}$ circuit output. FIG. 22 shows the program code for the example of FIG. 21.

When last test element T4 is in the extra internal condition, it is sometimes advantageous for primary output PO of element T4 to asynchronously receive primary input signal $P_{I4}$ and/or storage signal $S_4$ rather than test input signal $T_{I4}$. FIG. 23 illustrates a variation of FIG. 19 modified in this manner. FIGS. 24a–24d depict part of the programmable internal conditions into which element T4 can be placed in the circuit of FIG. 23 when there is one extra test bit C and two extra inputs EI. In particular, FIGS. 24a–24d illustrate four implementations of the extra internal condition. The transparent, observability, real-time controllability, and state controllability internal conditions for the circuit of FIG. 23 are the same as for the circuit of FIG. 19.

Due to the symbology utilized to generally represent the internal test-element conditions, last test element T4 in FIG. 23 appears the same as in FIG. 19. FIGS. 24a and 24d illustrate the difference between the two versions of element T4. In FIG. 24a, primary input signal $P_{I4}$ and a first extra input signal $E_I$ are respectively supplied asynchronously to outputs PO and TO of element T4. In FIG. 24b, storage signal S4 and the first extra input signal $E_I$ are respectively provided asynchronously to outputs PO and TO of element T4. FIGS. 24c and 24d basically repeat the implementations of the extra internal condition in FIGS. 20c and 20d.

By using one or more additional programming bits in last test element T4, further implementations of the extra internal condition could be incorporated into the circuit of FIG. 23. For example, primary input signal $P_{I4}$ or storage signal $S_4$ could be furnished asynchronously to primary output PO of element T4 when its test output TO asynchronously receives the second extra input signal $E_I$.

Figure 25:
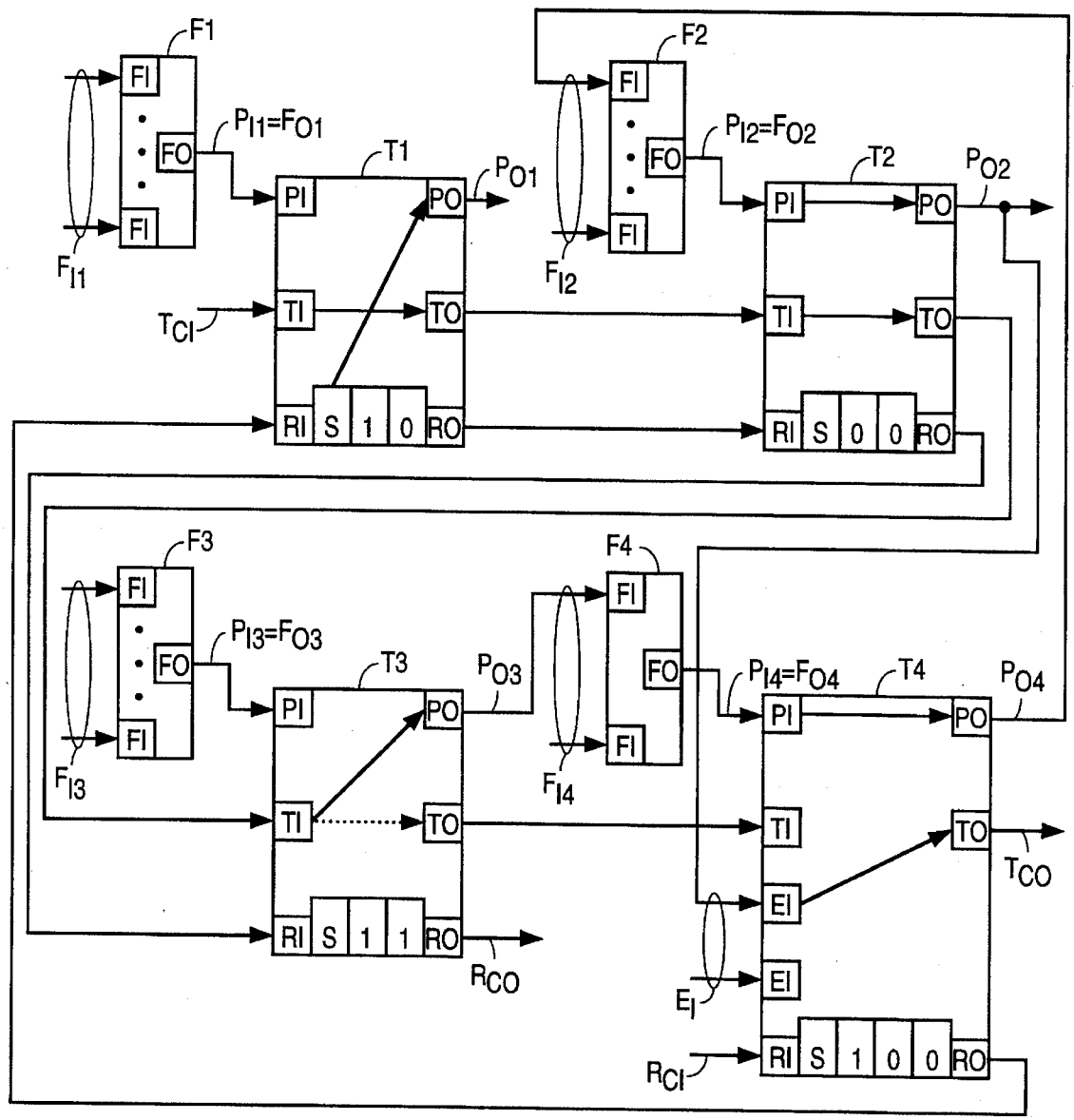
FIGS. 25 and 27 are block diagrams that demonstrate typical programming of the circuit in FIG. 23.

FIG. 25 presents a programmed example of the circuit of FIG. 23 in which last test element T4 is placed in the implementation of the extra internal condition where primary input signal $P_{I4}$ is supplied to primary output PO of element T4 in order to permit real-time $T_{CO}$ observation of output signal $F_{Oj}$ of a functional element Fj corresponding to an earlier test element Tj. Primary output signal $P_{O2}$ is furnished to the first extra input EI of element T4. Primary output signals $P_{O3}$ and $P_{O4}$ are respectively provided as input signals to functional elements F4 and F2.

Figure 26:
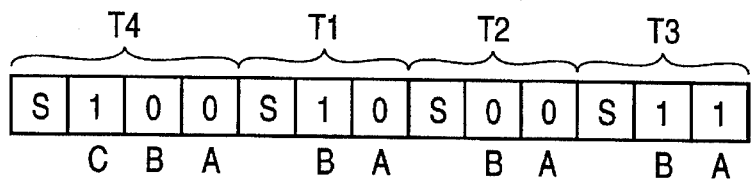
FIGS. 26 and 28 are diagrams of the program codes used respectively in FIGS. 25 and 27.

Test elements T1,–T3 in FIG. 25 are respectively in the state controllability, observability, and real-time controllability conditions. Real-time test data supplied through the $T_{CI}$ circuit input controls functional element F4 and, due to the primary input-primary output path through test element T4, controls earlier functional element F2 whose output signal $F_{O2}$ is observable in real time at the $T_{CO}$ circuit output. FIG. 26 shows the program code for the example of FIG. 25.

Figure 27:
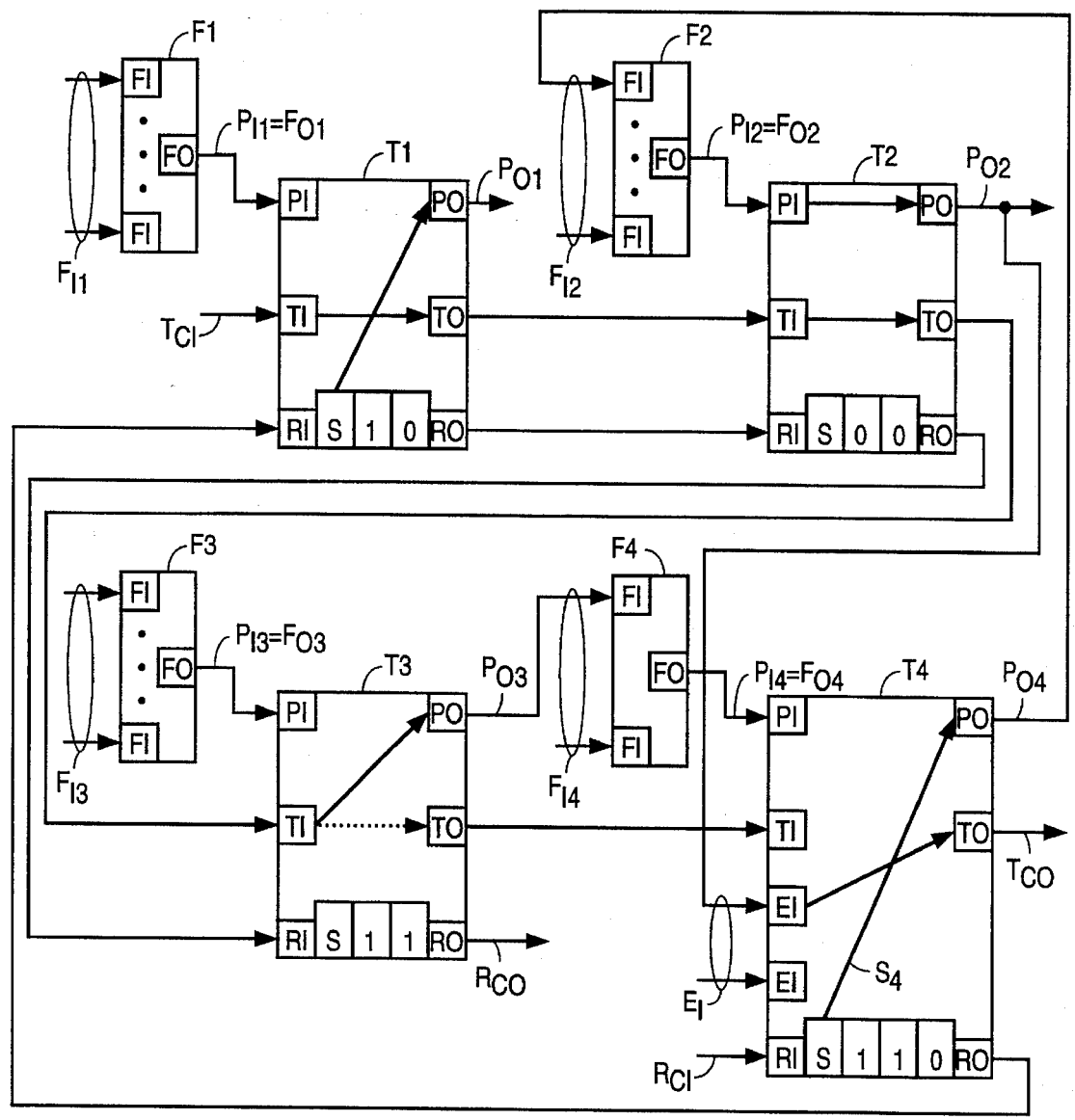
Figure 28:
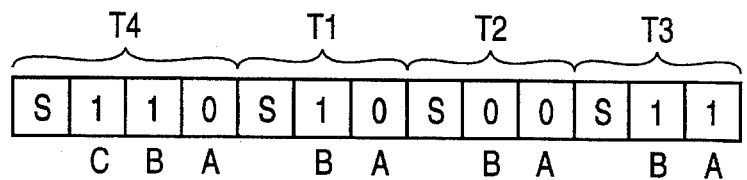

FIG. 27 presents a similar programmed example in which last test element T4 is placed in the implementation of the extra internal condition where storage signal $S_4$ is furnished to primary output PO of last test element T4 so as to permit real-time $T_{CO}$ observation of output signal $F_{Oj}$ of a functional element Fj corresponding to an earlier test element Tj. Primary output signals $P_{O2}$–$P_{O4}$ are supplied to the same circuit locations as in FIG. 25. Likewise, test elements T1–T3 are placed in the same internal conditions as in FIG. 25. As a result, storage signal S4 controls functional element F2 whose output signal $F_{O2}$ is observable in real time at the $T_{CO}$ circuit output by way of the first extra input EI. FIG. 28 depicts the program code for the example of FIG. 27.

As indicated in FIGS. 1 and 7, register inputs RI and outputs RO are normally connected in the same series as test inputs TI and outputs TO. However, it is sometimes advantageous to connect register inputs RI and outputs RO in a different order than test inputs TI and outputs TO. Such a situation may arise when, for a group of tests, the amount of data shifting through the shift registers in test elements T1–T4 can be reduced by using a test element Tj other than element T1 to introduce data into the shift registers. Returning to FIG. 23, it illustrates an example in which register input $R_{I4}$ is the $R_{CI}$ circuit input. Register output $R_{O3}$ is the $R_{CO}$ circuit output.

In implementing the real-time controllability internal condition, primary input signal $P_{Ij}$ of each test element Tj can be provided asynchronously to its test output TO when test input signal $T_{Ij}$ is supplied to primary output PO of element Tj. This variation, which is referred to here as the crossing real-time controllability internal condition, can be utilized as a substitute for, or in addition to, the main real-time controllability implementation described above in which test input signal $T_{Ij}$ is optionally furnished to test output TO of element Tj when its primary output PO receives signal $T_{ij}$.

FIG. 29 illustrates an extension of FIG. 19 that incorporates both of the real-time controllability internal conditions—i.e., the main and crossing real-time controllability conditions as well as the transparent, observability, and state controllability conditions. The number of internal conditions for each test element Tj thereby rises to five. Since this exceeds the storage capacity of the "A" and "B" storage units in the shift register of element Tj, the Tj shift register is furnished with an additional storage unit, again typically a flip-flop, for storing a bit D to accommodate the crossing real-time controllability condition.

FIGS. 30a–30d depict part of the programmable internal conditions for the circuit of FIG. 29. The transparent, observability, and state controllability conditions corresponding to FIGS. 8a, 8b, and 8d are respectively shown in FIGS. 30a, 30b, and 30d. FIG. 30c shows the crossing real-time controllability condition in which signals $P_{Ij}$ and $T_{Ij}$ of each test element Tj are respectively supplied asynchronously to its outputs TO and PO.

Figure 31:
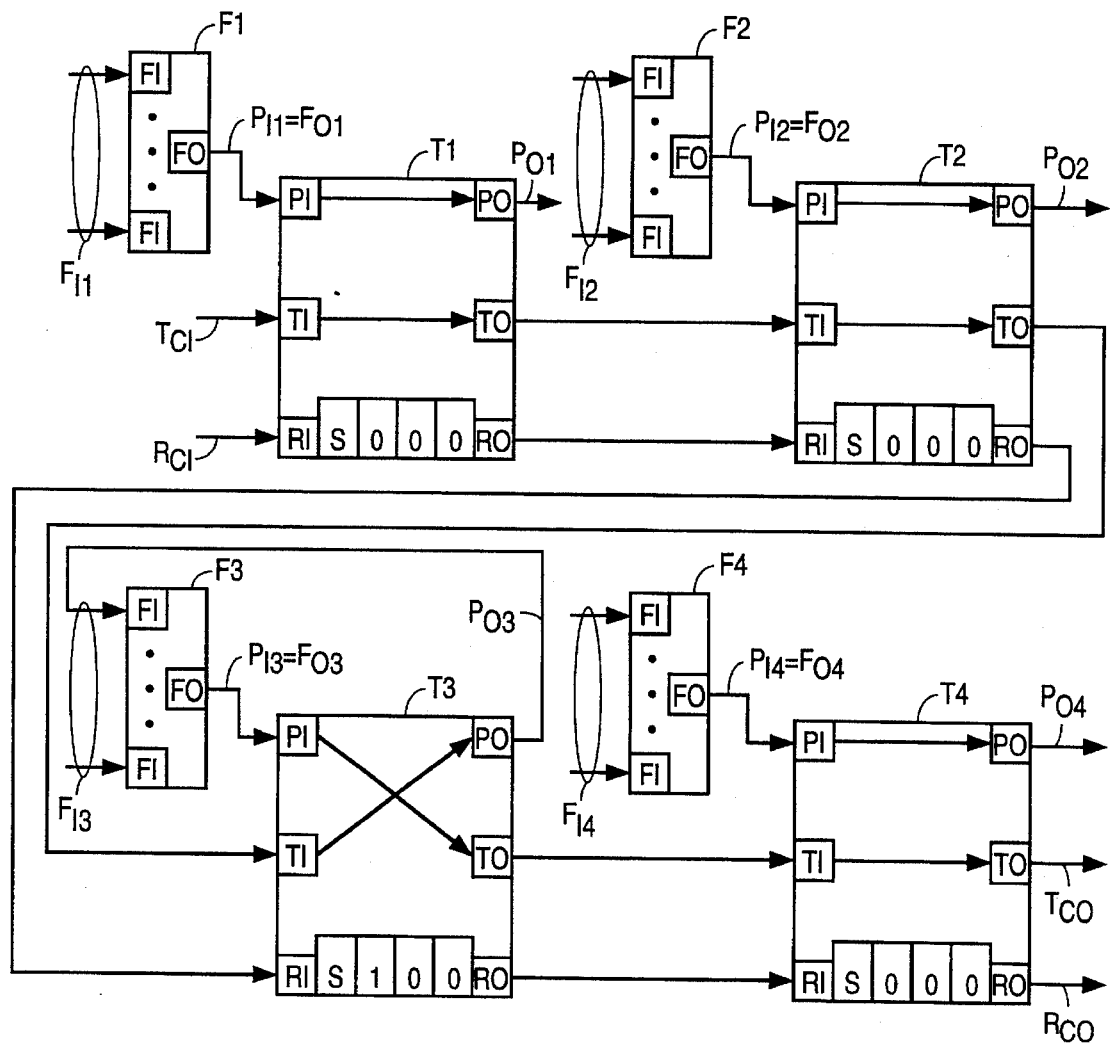
FIG. 31 is a block diagram that demonstrates typical programming of the circuit in FIG. 29.
Figure 32:
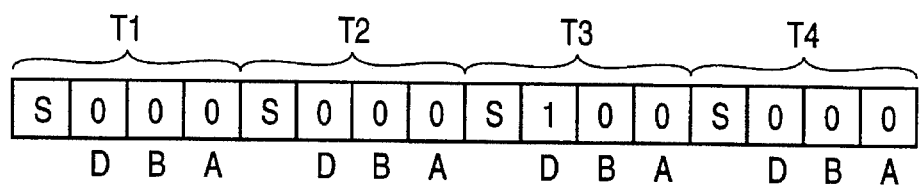
FIG. 32 is a diagram of the program code used in FIG. 31.

FIG. 31 presents an example of how the crossing real-time controllability of FIG. 30c is combined with $T_{CO}$ circuit observability in the circuit of FIG. 29. Test elements T1, T2, and T4 are in the transparent internal condition. Test element T3 is in the crossing real-time controllability condition with primary output signal $P_{O3}$ being fed back as an input signal to functional element F3. As a result, element F3 is typically an asynchronous storage element. Real-time test data supplied through the $T_{CI}$ circuit input is used to exercise element F3 while its output signal $F_{O3}$ is observable in real time at the $T_{CO}$ circuit output. FIG. 32 shows the associated program code for the example of FIG. 31.

As described above, in an application where only $T_{CO}$ observability is needed, the circuitry that implements controllability in each test element $T_j$ can be deleted along with all the shift-register storage units except for the "A" storage unit. Furthermore, output PO in each element Tj can be deleted. Since primary output signal $P_{Oj}$ is no longer present, output signal $F_{Oj}$ of each functional element Fj is provided to the normal circuit node or nodes to which signal Fj would be supplied if test element Tj were not present.

Figure 33:
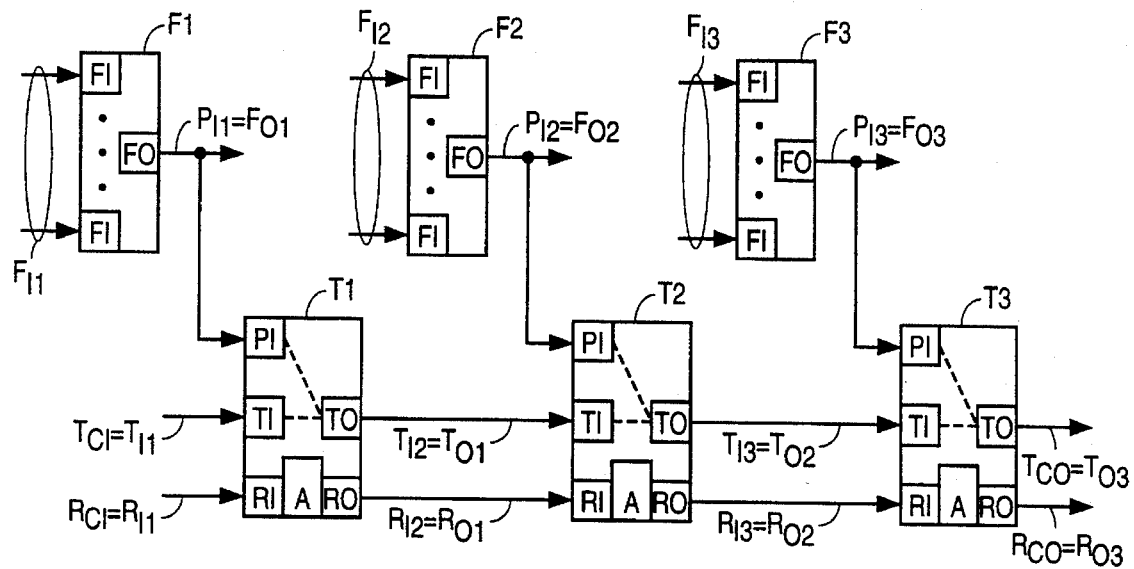
FIG. 33 is a block diagram of a further electronic circuit configured to be internally testable according to the invention.

FIG. 33 illustrates a circuit simplified in the preceding manner according to the invention. This circuit contains three functional elements F1–F3 and three corresponding test elements T1–T3. Bit A in each test element Tj now simply determines whether its test output TO asynchronously receives test input signal $T_{ij}$ or primary input signal $P_{Ij}$. Even though the $T_{CI}$ circuit input is not used for controlling function elements F1–F3 here, the $T_{CI}$ circuit input can be employed to check the observability path through test elements T1–T3. Alternatively, the $T_{CI}$ circuit input can be deleted along with test input TI in first test element T1.

Figure 34:
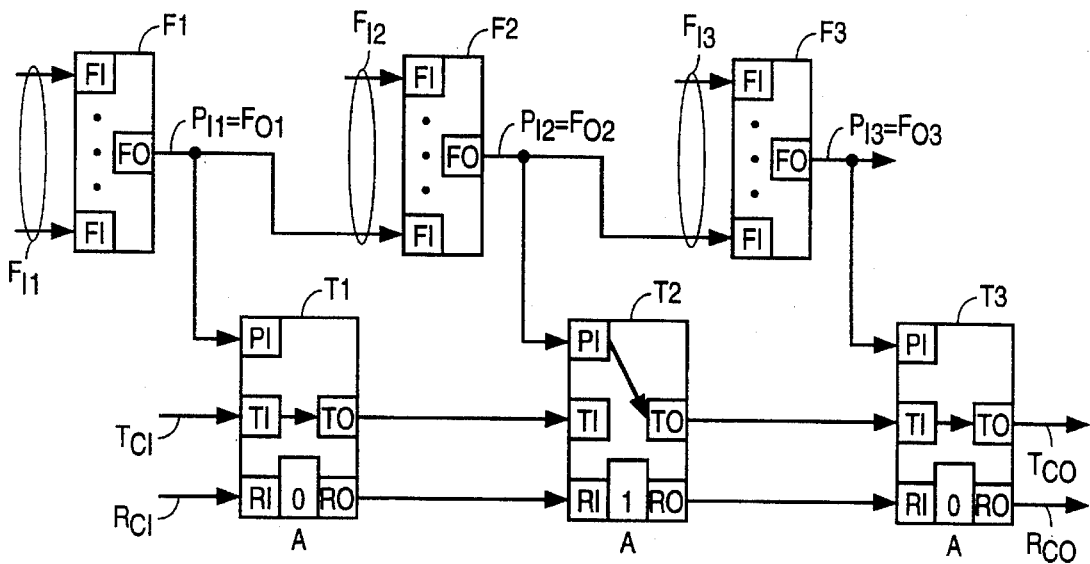
FIG. 34 is a block diagram that demonstrates typical programming of the circuit in FIG. 33.

FIG. 34 presents an example that demonstrates how observability is achieved in the circuit of FIG. 33. Function output signals $F_{O1}$ and $F_{O2}$ respectively constitute input signals to functional elements F2 and F3. Test elements T1 and T3 are in the transparent internal condition. Test element T2 is in the observability internal condition. Consequently, function output signal $F_{O2}$ is observable in real time at the $T_{CO}$ circuit output.

While the invention has been described with reference to particular embodiments, this description is solely for the purpose of illustration and is not to be construed as limiting the scope of the invention claimed below. For example, the internal test-element conditions could be identified by different shift-register bit values than those given above. The storage units of each shift register could be arranged in a different order than indicated in FIG. 1, 9, 19, 23, or 29.

When state controllability is present in the circuit, each test element has been described as capable of being placed in the state controllability internal condition. However, in some applications, it may be adequate for only part of the test elements to be capable of being placed in the state controllability internal condition. Like comments apply to each of the real-time controllability conditions (main and crossing). Similarly, primary output PO could be present in some test elements but not in others. In short, there may be a substantial variation in capabilities among the test elements.

The shift registers could be replaced with programmable storage elements of the RAM (static or dynamic) or EPROM/EEPROM type. The shift registers or other programmable storage elements could be located in a central memory rather than being distributed among the test elements. Various modifications and applications may thus be made by those skilled in the art without departing from the true scope and spirit of the invention as defined in the appended claims.

I claim:

1. An electronic circuit comprising:

a plurality of functional elements, each producing a function output signal; and a like plurality of test elements respectively corresponding to the functional elements, each test element having (a) a primary input that receives a primary input signal as the function output signal of the corresponding functional element, (b) a test input that receives a test input signal, and (c) a test output, the test elements being arranged in series by way of their test inputs and test outputs such that the test output of each test element up to the last one is coupled to the test input of the next test element, each test element being capable of being switched between a transparent internal condition in which its test input signal is provided asynchronously to its test output and an observability internal condition in which its primary input signal is provided asynchronously to its test output.

2. A circuit as in claim 1 wherein one of the function output signals is provided directly as a function input signal to one of the functional elements.

3. A circuit as in claim 1 wherein each test element has a primary output, the primary input signal of each test element being provided asynchronously to its primary output when that test element is in the transparent internal condition.

4. A circuit as in claim 3 wherein the primary input signal of one of the test elements is provided asynchronously to its primary output when that test element is in the observability internal condition.

5. A circuit as in claim 4 wherein the primary output of each test element provides a primary output signal to a circuit node to which the function output signal of the corresponding functional element would be provided in the absence of that test element.

6. A circuit as in claim 4 wherein each functional element produces its function output signal by performing an electronic function on function input signal information.

7. A circuit as in claim 6 wherein the function output signal of one of the function elements is asynchronously dependent on the function input information to that functional element.

8. A circuit as in claim 6 wherein the primary output signal of one of the test elements is fed back as part of the function input information to the corresponding functional element.

9. A circuit as in claim 4 wherein a circuit test output signal is supplied from the test output signal of the last test element in the series of test elements.

10. A circuit as in claim 9 wherein the functional and test elements are part of an integrated circuit having a test output pin for providing the circuit test output signal.

11. A circuit as in claim 4 wherein the plurality of functional or test elements is greater than two.

12. A circuit as in claim 4 wherein at least one of the elements performs asynchronous combinational logic.

13. A circuit as in claim 4 wherein one of the test elements contains a programmable section which stores program information that determines the internal condition of that test element.

14. A circuit as in claim 4 wherein:
each test element contains a shift register which stores program information that determines the internal condition of that test element, a register input signal to the shift register being provided at the register input, a register output signal from the shift register being provided at the register output; and
the test elements are arranged in series by way of their register inputs and register outputs such that the register output of each test element up to the last one is coupled to the register input of the next test element.

15. A circuit as in claim 14 wherein the series in which the test elements are arranged according to their register inputs and register outputs is the same as the series in which the test elements are arranged according to their test inputs and test outputs.

16. A circuit as in claim 4 wherein one of the test elements is further capable of being switched to a real-time controllability internal condition in which its test input signal is provided asynchronously to its primary output.

17. A circuit as in claim 16 wherein the test input signal of the test element capable of being switched to the real-time controllability internal condition is provided asynchronously to its test output when that test element is in the real-time controllability internal condition.

18. A circuit as in claim 16 wherein the primary input signal of the test element capable of being switched to the real-time controllability internal condition is provided asynchronously to its test output when that test element is in the real-time controllability internal condition.

19. A circuit as in claim 16 wherein (a) a circuit test input signal is supplied to the test input of the first test element in the series of test elements and (b) a circuit test output signal is supplied from the test output of the last test element in the series of test elements.

20. A circuit as in claim 19 wherein the functional and test elements are part of an integrated circuit having (a) a test input pin for receiving the circuit test input signal and (b) a test output pin for providing the circuit test output signal.

21. A circuit as in claim 16 wherein one of the test elements contains a programmable section which stores program information that determines the internal condition of that test element.

22. A circuit as in claim 4 wherein one of the test elements (a) contains a storage unit that provides a storage signal indicative of test information placed in the storage unit and (b) is further capable of being switched to a state controllability internal condition in which its test input and storage signals are respectively provided asynchronously to its test and primary outputs.

23. A circuit as in claim 22 wherein one of the test elements contains a programmable section which stores program information that determines the internal condition of that test element.

24. A circuit as in claim 22 wherein:
each test element contains a shift register which stores program information that determines the internal condition of that test element, a register input signal to the shift register being provided at the register input, a register output signal from the shift register being provided at the register output; and
the test elements are arranged in series by way of their register inputs and register outputs such that the register output of each test element up to the last one is coupled to the register input of the next test element.

25. A circuit as in claim 24 wherein the storage unit is part of the shift register in the test element containing the storage unit.

26. A circuit as in claim 22 wherein one of the test elements is further capable of being switched to a real-time controllability internal condition in which its test input signal is provided asynchronously to its primary output.

27. A circuit as in claim 26 wherein one of the test elements contains a programmable section which stores program information that determines the internal condition of that test element.

28. A circuit as in claim 26 wherein a specified one of the test elements is further capable of being switched to an extra internal condition in which an extra input signal is provided asynchronously to the test output of that test element.

29. A circuit as in claim 28 wherein the test input signal of the specified test element is provided asynchronously to its primary output when the specified test element is in the extra internal condition.

30. A circuit as in claim 28 wherein the primary input signal of the specified test element is provided asynchronously to its primary output when the specified test element is in the extra internal condition.

31. A circuit as in claim 28 wherein the storage signal of the specified test element is provided asynchronously to its primary output when the specified test element is in the extra internal condition.

32. A circuit as in claim 28 wherein the extra input signal is the primary or test output signal of one of the test elements other than the specified test element.

33. A circuit as in claim 28 wherein the specified test element is the last test element in the series of test elements arranged according to their test inputs and test outputs.

34. A circuit as in claim 3 wherein the primary input signal of each test element is provided asynchronously to its primary output when that test element is in the observability internal condition.

35. A circuit as in claim 34 wherein each test element is further capable of being switched to a real-time controllability internal condition in which its test input signal is provided asynchronously to its primary output.

36. A circuit as in claim 34 wherein each test element (a) contains a storage unit that provides a storage signal indicative of test information placed in the storage unit and (b) is further capable of being switched to a state controllability internal condition in which its test and storage signals are respectively provided asynchronously to its test and primary outputs.

37. A circuit as in claim 36 wherein a specified one of the test elements is further capable of being switched to an extra internal condition in which a selected one of a further plurality of extra input signals is provided asynchronously to the test output of that test element.

38. An electronic circuit comprising:
  a plurality of functional elements, each producing a function output signal; and
  a like plurality of test elements respectively corresponding to the functional elements, each test element having (a) a primary input that receives a primary input signal as the function output signal of the corresponding functional element, (b) a primary output, (c) a test input that receives a test input signal, and (d) a test output, the test elements being arranged in series by way of their test inputs and test outputs such that the test output of each test element up to the last one is coupled to the test input of the next test element, each test element being capable of being switched between a transparent internal condition in which its primary and test input signals are respectively provided asynchronously to its primary and test outputs and a real-time controllability internal condition in which its test input signal is provided asynchronously to its primary output.

39. A circuit as in claim 38 wherein one of the test elements (a) contains a storage unit that provides a storage signal indicative of test information placed in the storage unit and (b) is further capable of being switched to a state controllability internal condition in which its test input and storage signals are respectively provided asynchronously to its test and primary outputs.

40. A circuit as in claim 39 wherein one of the test elements contains a programmable section which storage program information that determines the internal condition of that test element.

41. An electronic circuit comprising:
  a plurality of function elements, each producing a function output signal; and
  a like plurality of test elements respectively corresponding to the functional elements, each test element having (a) a primary input that receives a primary input signal as the function output signal of the corresponding functional element, (b) a primary output, (c) a test input that receives a test input signal, and (d) a test output, the test elements being arranged in series by way of their test inputs and test outputs such that the test output of each test element up to the last one is coupled to the test input of the next test element, each test element containing a storage unit that provides a storage signal indicative of test information placed in the storage unit, each test element being capable of being switched between a transparent internal condition in which its primary and test output signals are respectively provided asynchronously to its primary and test outputs and a state controllability internal condition in which its test input and storage signals are respectively provided asynchronously to its test and primary outputs.

42. A circuit as in claim 41 wherein one of the test elements contains a programmable section which stores program information that determines the internal condition of that test element.

43. A method of testing an electronic circuit that comprises a plurality of functional elements, each performing an electronic function on function input signal information to produce a function output signal, the circuit being furnished with a like plurality of test elements respectively corresponding to the functional elements, each test element having (a) a primary input that receives a primary input signal as the function output signal of the corresponding functional element, (b) a test input that receives a test input signal, and (c) a test output, the test elements being arranged in series such that the test output of each test element up to the last one is coupled to the test input of the next test element, the method comprising the steps of:
  programmably placing each test element in a selected one of a group of internal conditions that include (a) a transparent condition in which the test input signal of a test element is provided asynchronously to its test output and (b) an observability condition in which the primary input signal of a test element is provided asynchronously to its test output;
  providing part of the function input information at selected values to exercise the circuit; and
  observing the effect of the providing step at a circuit test output coupled to the test output of the last test element in the series of test elements.

44. A method as in claim 43 wherein each test element has a primary output, the primary input signal of each test element being provided asynchronously to its primary output when that test element is in the transparent internal condition or the observability internal condition.

45. A method as in claim 44 wherein the primary output of each test element provides a primary output signal to a circuit node to which the function output signal of the corresponding functional element would be provided in the absence of that test element.

46. A method as in claim 44 wherein the internal conditions include a real-time controllability condition in which the test input signal of one of the test elements is provided asynchronously to its primary output, data being furnished during the providing step to a circuit test input coupled to the test input of the first test element in the series of test elements.

47. A method as in claim 46 wherein (a) one of the test elements contains a storage unit that provides a storage signal indicative of test information stored in that storage unit and (b) the internal conditions include a state controllability condition in which the test input and storage signals of that test element are respectively provided asynchronously to its test and primary outputs.

48. A method as in claim 43 wherein the programmably placing step comprises:
  programming the test elements with data suitable to place each of them in a selected one of the internal conditions; and
  enabling test operation so that each test element goes into its selected internal condition.

49. A method of testing an electronic circuit that comprises a plurality of functional elements, each performing an electronic function on function input signal information to produce a function output signal, the circuit being furnished with a like plurality of test elements respectively corresponding to the functional elements, each test element having (a) a primary input that receives a primary input signal as the function output signal of the corresponding functional element, (b) a primary output, (c) a test input that receives a test input signal, and (d) a test output, the test elements being arranged in series such that the test output of each test element up to the last one is coupled to the test input of the next test element, the method comprising the steps of:

programmably placing each test element in a selected one of a group of internal conditions that include (a) a transparent condition in which the primary and test input signals of a test element are respectively provided asynchronously to its primary and test outputs and (b) a real-time controllability condition in which the test input signal of a test element is provided asynchronously to its primary output; and providing part of the function input information at selected values to exercise the circuit.

50. A method as in claim 49 wherein (a) one of the test elements contains a storage unit that provides a storage signal indicative of test information stored in that storage unit and (b) the internal conditions include a state controllability condition in which the test input and storage signals of that test element are respectively provided asynchronously to its test and primary outputs.

51. A method of testing an electronic circuit that comprises a plurality of functional elements, each performing an electronic function on function input signal information to produce a function output signal, the circuit being furnished with a like plurality of test elements respectively corresponding to the functional elements, each test element having (a) a primary input that receives a primary input signal as the function output signal of the corresponding functional element, (b) a primary output, (c) a test input that receives a test input signal, and (d) a test output, the test elements being arranged in series such that the test output of each test element up to the last one is coupled to the test input of the next test element, each test element containing a storage unit that provides a storage signal indicative of test information placed in the storage unit, the method comprising the steps of:

programmably placing each test element in a selected one of a group of internal conditions that include (a) a transparent condition in which the primary and test input signals of each test element are provided asynchronously to its primary and test outputs and (b) a state controllability condition in which the test input and storage signals of each test element are provided asynchronously to its test and primary outputs; and providing part of the function input information at selected values to exercise the circuit.

52. A method as in claim 51 wherein the programming step entails simultaneously shifting program data into the test elements.

* * * * *